US011670357B2

(12) United States Patent
Visconti et al.

(10) Patent No.: US 11,670,357 B2
(45) Date of Patent: Jun. 6, 2023

(54) MEMORY SYSTEM CONFIGURED TO PERFORM A RESET ON ONE OR MORE NON-VOLATILE MEMORY CELLS UPON TRANSITIONING POWER STATES

(71) Applicant: Micron Technology, Inc., Boise, ID (US)

(72) Inventors: Angelo Visconti, Appiano Gentile (IT); Jahanshir J. Javanifard, Carmichael, CA (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 17/350,757

(22) Filed: Jun. 17, 2021

(65) Prior Publication Data

US 2022/0406356 A1    Dec. 22, 2022

(51) Int. Cl.
*G11C 7/12* (2006.01)
*G11C 11/4074* (2006.01)
*G11C 11/4096* (2006.01)
*G11C 11/408* (2006.01)
*G11C 11/4072* (2006.01)
*G11C 11/22* (2006.01)

(52) U.S. Cl.
CPC ........ *G11C 11/4074* (2013.01); *G11C 11/221* (2013.01); *G11C 11/2275* (2013.01); *G11C 11/2277* (2013.01); *G11C 11/2297* (2013.01); *G11C 11/4072* (2013.01); *G11C 11/4085* (2013.01); *G11C 11/4096* (2013.01)

(58) Field of Classification Search
CPC .............. G11C 11/4074; G11C 11/221; G11C 11/2275; G11C 11/2277; G11C 11/2297; G11C 11/4072; G11C 11/4085; G11C 11/4096
See application file for complete search history.

(56) References Cited

U.S. PATENT DOCUMENTS

| 10,056,129 B1* | 8/2018 | Sakurai | G11C 11/221 |
| 10,229,727 B1 | 3/2019 | Sakurai et al. | |
| 10,622,050 B2 | 4/2020 | El-Mansouri et al. | |
| 10,964,385 B1* | 3/2021 | Yang | G11C 13/0069 |
| 2016/0118104 A1* | 4/2016 | Guz | G11C 11/4072 365/203 |
| 2021/0233584 A1* | 7/2021 | Sarpatwari | G11C 5/144 |
| 2021/0358546 A1* | 11/2021 | Sinipete | G11C 13/0033 |

FOREIGN PATENT DOCUMENTS

| CN | 112233711 B * | 3/2022 | ........... G11C 11/221 |
| TW | 201737259 A * | 10/2017 | ............. G06F 12/02 |
| WO | WO-2022226474 A1 * | 10/2022 | ......... G11C 13/0004 |

* cited by examiner

*Primary Examiner* — Mushfique Siddique
(74) *Attorney, Agent, or Firm* — Holland & Hart LLP

(57) ABSTRACT

Methods, systems, and devices for cell data bulk reset are described. In some examples, a logic state (e.g., a first logic state) may be written to one or more memory cells based on an associated memory device transitioning power states. To write the first logic state to the memory cells, a first subset of digit lines may be driven to a first voltage and a plate may be driven to a second voltage. While the digit lines and plate are driven to the respective voltages, one or more word lines may be driven to the second voltage. In some instances, the word lines may be driven to the second voltage based on charge sharing occurring between adjacent word lines.

25 Claims, 12 Drawing Sheets

US 11,670,357 B2

MEMORY SYSTEM CONFIGURED TO PERFORM A RESET ON ONE OR MORE NON-VOLATILE MEMORY CELLS UPON TRANSITIONING POWER STATES

FIELD OF TECHNOLOGY

The following relates generally to one or more systems for memory and more specifically to cell data bulk reset.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
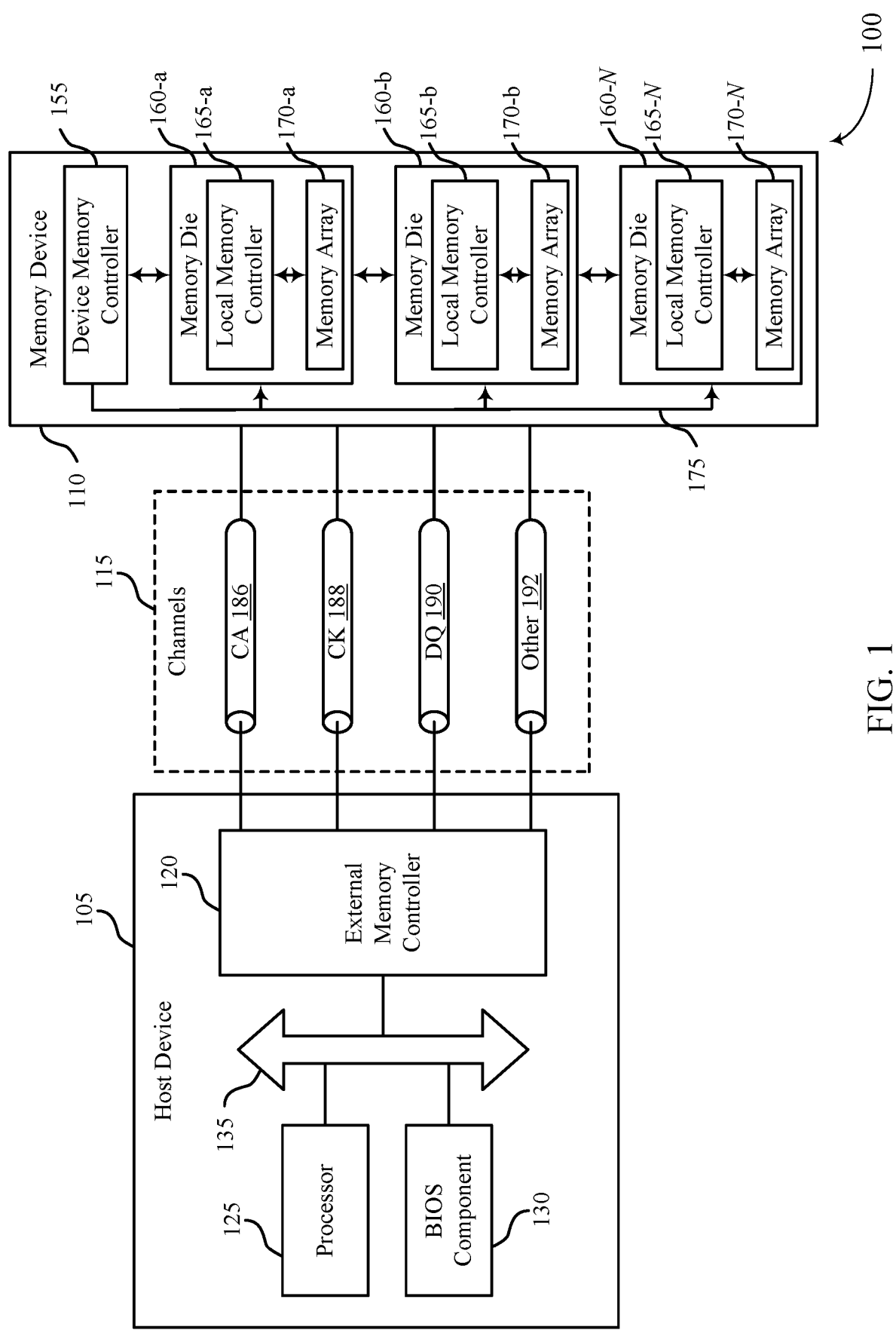
FIG. 1 illustrates an example of a system that supports cell data bulk reset in accordance with examples as disclosed herein.

Electronic devices, such as memory devices, may include memory such as dynamic random-access memory (DRAM). Because DRAM (and other similar memory types) is volatile in nature, it may store data only during the time it is powered up (e.g., or for only a short transient time after). In other words, volatile memory requires power to maintain stored information. In some memory devices, non-volatile memory may be a suitable replacement for DRAM. However, because non-volatile memory does not require power to maintain stored data, the data may be susceptible to being accessed even after the memory device has been powered off. That is, because a memory system may be configured to utilize volatile memory and may not have security practices in place for data retained in the memory after power is removed, replacing the volatile memory with non-volatile memory may pose security threats. Thus, use of non-volatile memory as a replacement for volatile memory may present challenges.

A memory system configured to perform a bulk reset on one or more non-volatile memory cells upon transitioning power states is described herein. In some examples, when a memory system powers off (or on), some data may be reset (e.g., reprogrammed) to minimize security risks that would otherwise arise due to the non-volatile nature of the memory. In a first example, a set of memory cells (e.g., which may be a portion of memory cells of the memory device) may be programmed to a first logic state (e.g., a logic "0") upon the memory system powering on or powering off. To program the set of memory cells, one or more digit lines associated with the set of memory cells may be driven to a first voltage (e.g., ground, VSS), a plate line associated with the set of memory cells may be driven to a second voltage (e.g., a supply voltage, VDD1), and a group of word lines (e.g., which may have one or more word lines) associated with a subset of the set of memory cells may be asserted (e.g., driven to the second voltage). Additional groups of word lines may be sequentially asserted to program additional subsets of the set of memory cells to the first logic state. Accordingly, the set of memory cells may be programmed to the first logic state, which may mitigate any security risks that the memory system may otherwise be susceptible to when transitioning power states.

In some examples, the sequential assertion of additional word lines may be asserted based on charge sharing between one or more word lines. When transitioning between asserting the first group of word lines to asserting the second group of word lines, charge may be shared between the first group of word lines and the second group of word lines, and may increase the voltage of the second group of word lines to an intermediate voltage (e.g., to a voltage greater than 0V but less than VDD1). The first group of word lines may then be de-asserted (e.g., driven to VSS), and the second group of word lines may be driven from the intermediate voltage to the second voltage, which may save power. Accordingly, the set of memory cells may be programmed to the first logic state using less power than if all word lines are asserted using the power supply to drive the word lines from the de-asserted state (e.g., VSS) to the asserted state (e.g., VDD1). The power savings may reduce the instantaneous current used by the memory device, which may allow the memory device to perform the bulk reset faster, or may allow the memory device to bulk reset more rows using a limited power source such as remaining charge on a capacitor on the power supply.

Figure 2:
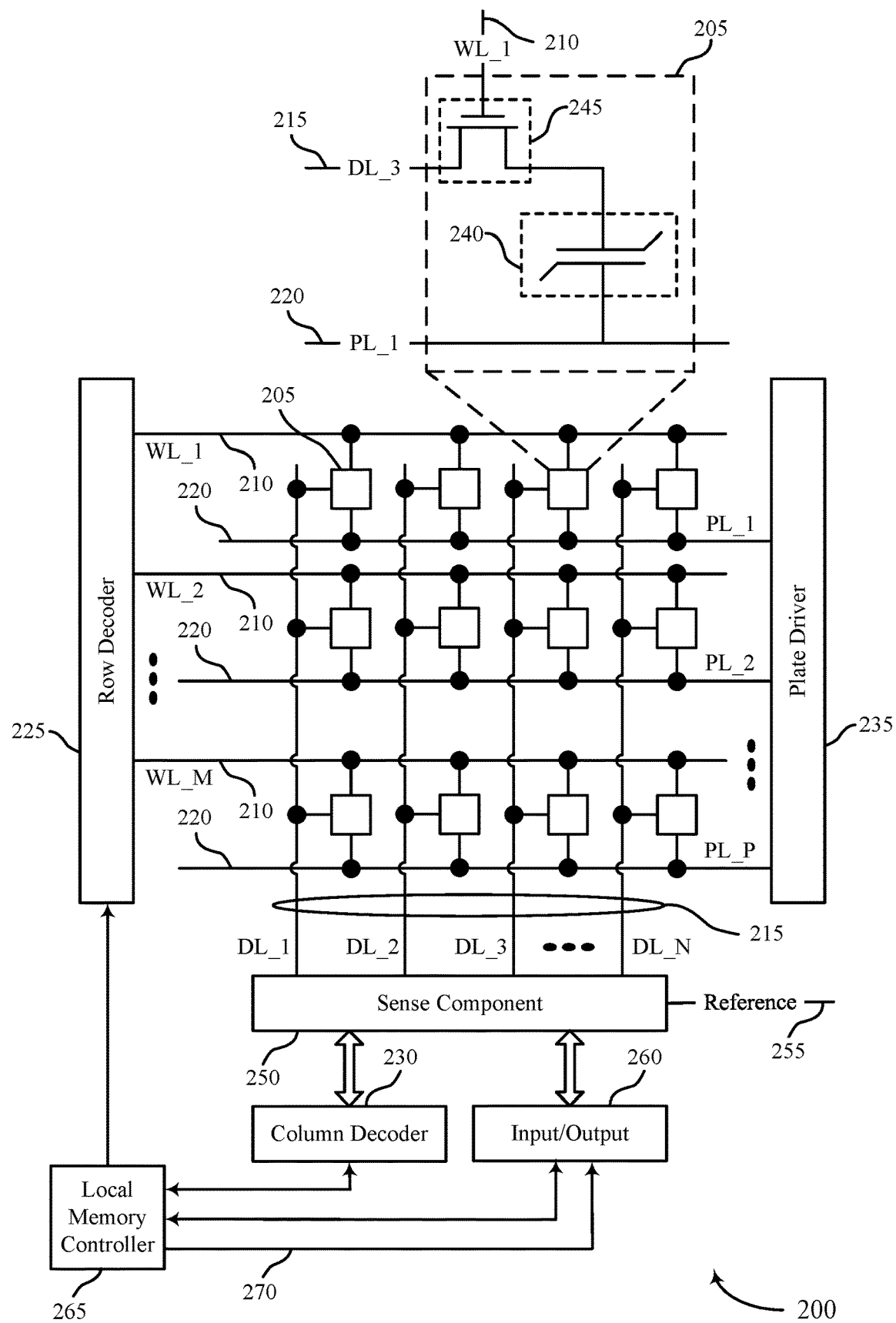
FIG. 2 illustrates an example of a memory die that supports cell data bulk reset in accordance with examples as disclosed herein.

Features of the disclosure are initially described in the context of systems and dies with reference to FIGS. 1 and 2. Features of the disclosure are described in the context of circuit diagrams, timing diagrams, and a plot with reference to FIGS. 3-8. These and other features of the disclosure are further illustrated by and described with reference to an apparatus diagram and flowcharts that relate to cell data bulk reset as described with reference to FIGS. 9-12.

FIG. 1 illustrates an example of a system 100 that supports cell data bulk reset in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160 *a*, memory die 160 *b*, memory die 160 N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, a force write operation may be performed on one or more memory cells of the memory arrays 170. For example, the memory device 110 may receive a command or signaling (e.g., from the host device 105) to transition from a first power state to a second power state. Upon receiving the command or signaling, a local memory controller 165 may initiate driving one or more digit lines of a memory array 170 to a first voltage (e.g., to VSS, to ground) and one or more plate lines to a second voltage (e.g., to VDD1). Moreover, the local memory controller 165 may assert a group of word lines (e.g., drive one or more word lines to the second voltage, VDD1), which may result in a positive write pulse 175 being applied across one or more memory cells. The positive write pulse 175 may result in a first logic state (e.g., a logic "0") being written to the memory cell. That is, if the memory cell was already in the first logic state it may remain in the first logic state, and if the memory cell was in the second logic state it may be written to the first logic state. Because the memory cells of the memory device 110 may be non-volatile memory cells and thus may retain data when powered off, performing a force write operation on the memory cells may prevent valid data from being stored when transitioning power states, which may otherwise pose a security risk to the memory device 110. The force write operation may be performed on power down (e.g., when an indication that power will be removed is received, or when power is removed), on power up (e.g., upon detecting power being supplied after being powered down), or on both power down and power up.

FIG. 2 illustrates an example of a memory die 200 that supports cell data bulk reset in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. Although illustrated in FIG. 2 as running in the same direction as word lines 210, plate lines 220 may run in the same direction as digit lines 215, or a single plate line 220 may be coupled with a group of memory cells 205 spanning one or more word lines 210 or digit lines 215 (e.g., spanning a subset of memory cells 205 associated with one or more word lines and a subset of memory cells 205 associated with one or more digit lines 215).

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a specific signal (e.g., write pulse 270) to the digit line 215 during the write operation to store a specific state (e.g., charge) in the capacitor 240 of the memory cell 205. The pulse used as part of the write operation may include one or more voltage levels over a duration.

In some examples, a force write operation may be performed on one or more memory cells 205 of the memory die 200. For example, the local memory controller 265 may receive a command (e.g., from the host device 105 as described with reference to FIG. 1) or signaling (e.g., a change in condition of a power supply) to transition from a first power state to a second power state. Upon receiving the command or signaling, the local memory controller 265 may initiate driving one or more digit lines 215 to a first voltage (e.g., VSS) and driving one or more plate lines 220 to a second voltage (e.g., VDD1). Moreover, the local memory controller 265 may assert a group of word lines 210 (e.g., drive one or more word lines 210 to the second voltage (VDD1)), which may result in a positive write pulse 270 being applied across one or more memory cells 205. The positive write pulse 270 may result in a first logic state (e.g., a logic "0") being written to the memory cells 205. Because the memory cells 205 of the memory die 200 may be non-volatile memory cells and thus may retain data when powered off, performing a force write operation on the memory cells 205 may prevent valid data from being stored when transitioning power states, which may otherwise pose a security risk for data stored by the host device 105.

Figure 3:
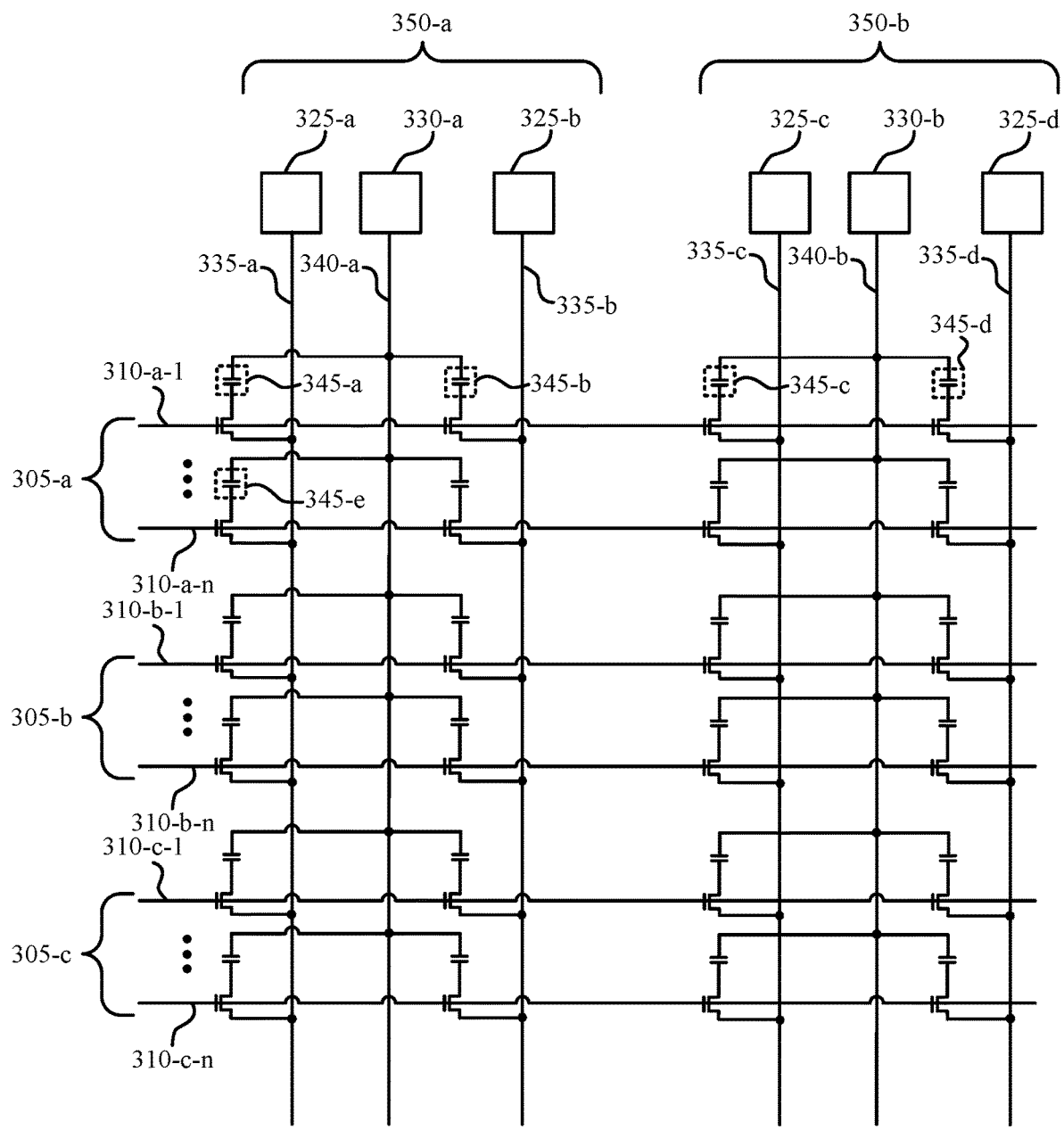
FIG. 3 illustrates an example of a circuit diagram that supports cell data bulk reset in accordance with examples as disclosed herein.

FIG. 3 illustrates an example of a circuit diagram 300 that supports cell data bulk reset in accordance with examples as disclosed herein. The circuit diagram 300 may illustrate aspects of an array of non-volatile memory cells 345. For example, the circuit diagram 300 may illustrate non-volatile memory cells 345 that are each coupled with a word line of a respective word line group 305, digit lines 335, and plate lines 340. The circuit diagram 300 may also illustrate drivers 325, which may be coupled with the digit lines 335, and drivers 330, which may be coupled with the plate lines 340. The word lines 310 of each word line group 305 may also be coupled with one or more drivers (not shown).

Each driver may be coupled with one or more voltage sources and may be configured to drive a respective line (e.g., a digit line 335, a plate line 340, or a word line 310) based on a voltage source coupled with the driver. For example, drivers may be coupled with a first voltage source (e.g., VSS), a second voltage source (e.g., VDD1), or a third voltage source (e.g., VMPL). In some instances, either an access operation (e.g., a write operation, a read operation) or a force write operation (e.g., a bulk reset operation) may be performed on memory cells 345 based on the drivers driving respective lines to respective voltages.

The circuit diagram 300 may support bulk reset operations, where a logic state (e.g., a first logic state, a logic "0") is written to a subset of memory cells 345 upon an associated memory device transitioning power states. For example, the first logic state may be written to the subset of memory cells 345 upon the memory device powering on or powering off. Because the memory cells 345 may be non-volatile memory cells and be configured to store data when powered off, force writing a first logic state to the memory cells 345 may reduce the likelihood of security threats to an associated memory device due to otherwise valid data being present subsequent to a power off event.

The circuit diagram may illustrate an array of non-volatile memory cells 345. In some examples, each memory cell 345 may be coupled with a word line 310 of a word line group 305. For example, the first word line group 305-a may include word lines 310-a-1 through 310-a-n, where n represents a positive integer. Each word line 310-a may be coupled with a respective word line driver (not shown). The word line drivers may be configured to drive the word lines 310-a to a first voltage (e.g., VSS or 0V) when the word lines 310-a are not selected, or to a second voltage (e.g., VDD1) when the word lines 310-a are selected (e.g., based on a row decoder such as row decoder 225).

In some instances, each word line group 305 may be configured similarly. For example, the second word line group 305-b may include word lines 310-b-1 through 310-b-n and the third word line group 305-c may include word lines 310-c-1 through 310-c-n, where n represents a positive integer. Each word line 310-b may be coupled with a driver (e.g., a respective driver). During an access operation (e.g., a normal write operation), a single word line 310 of a word line group 305 may be selected at a time. Conversely, during a bulk reset operation (e.g., during a force write operation), an entire word line group 305 may be selected at a time. For example, the word lines 310-a of the first word line group 305-a may be selected by a row decoder (e.g., by a row decoder 225 as described with reference to FIG. 2) while the word lines 310-b of the second word line group 305-b and the word lines 310-c of the third word line group 305-c are unselected. Thus, during a force write operation, one or more word lines 310-a may be driven to a second voltage (e.g., VDD1) while the word lines of the second word line group 305-b and the third word line group 305-c are unselected.

The memory cells 345 of each word line group 305 may be coupled with one or more digit lines 335. For example, the digit line 335-a may be coupled with memory cells 345 (e.g., a subset of memory cells 345) from each word line group 305. That is, the digit line 335-a may be coupled with a memory cell 345 located at the intersection of each word line of each word line group 305. Similarly, the digit line 335-b may be coupled with a memory cell 345 located at the intersection of each word line of each word line group 305. In some instances, the digit line 335-a and the digit line 335-b may be coupled with the drivers 325-a and 325-b, respectively. The drivers 325-a and 325-b may be coupled with at least a first voltage source and may be configured to apply one of a plurality of voltages (e.g., VSS, VDD1) to the digit lines 335-a and 335-b. For example, the drivers 325 may each be configured to apply a first voltage (e.g., VSS) to the digit lines 335 during a bulk reset operation. The digit lines 335 may also be coupled with sense amplifiers (not shown) for sensing logic values of the memory cells 345 for read operations.

The memory cells 345 of each word line group 305 may be coupled with at least one plate line 340 from a plate group 350. For example, the memory cells 345-a and 345-b may be coupled with a plate line 340-a from the plate group 350-a (e.g., the plate line 340-a may be coupled with a first plate). Similarly, the memory cells 345-c and 345-d may be coupled with a plate line 340-b from the plate group 350-b (e.g., the plate line 340-*b* may be coupled with a second plate). In some instances, the plate line 340-*a* and the plate line 340-*b* may be coupled with drivers 330-*a* and 330-*b*, respectively.

During a standard write operation, the drivers 330-*a* and 330-*b* may couple the plate lines 340-*a* and 340-*b* with a voltage source (e.g., VMPL) for programming memory cells 345 to a first logic state (e.g., a logic "0"). VMPL may be higher than a voltage supply to the memory device (e.g., VDD1) and may be generated by the memory device from the voltage supply. Moreover, the drivers 330-*a* and 330-*b* may couple the plate lines 340-*a* and 340-*b* with a different voltage source (e.g., VSS) for programming memory cells 345 to a second logic state (e.g., a logic "1"). As described herein, VMPL may be a same or a different voltage as VDD1. In the instances where VMPL is a different voltage than VDD1, during a bulk reset operation the drivers 330-*a* and 330-*b* may couple the plate lines 340-*a* and 340-*b* to VDD1 as it may have a greater ability to provide charge when a power source is removed from the associated memory device. That is, coupling the plate lines 340-*a* and 340-*b* to VDD1 may allow the associated memory device to perform a force write operation using the charge remaining on the capacitors of VDD1.

During a bulk reset operation, the drivers 330-*a* and 330-*b* may couple plate lines 340-*a* and 340-*b* with a second voltage source (e.g., VDD1). In some instances, VDD1 and VMPL may each be referred to as a "second voltage" and thus may each represent a same or similar voltage applied to the word lines and plate lines 340. During other operations, such as an access operation, the drivers 330-*a* and 330-*b* may couple the plate lines 340-*a* and 340-*b* with a different voltage source, such as VMPL as described above.

During a standard write operation, different voltages may be applied to the word lines, digit lines 335, and plate lines 340. For example, to write a logic "0" to the memory cell 345-*a* a positive voltage (e.g., VDD) may be applied to the plate line 340-*a* and the digit line 335-*a* may be grounded. While the positive voltage is applied to the plate line 340-*a* and while the digit line 335-*a* is grounded, the word line 310-*a*-1 may be asserted, which may result in a positive write pulse across the memory cell 345-*a*.

To write a logic "1" to the memory cell, a positive voltage (e.g., VDD) may be applied to the digit line 335-*a* and the plate line 340-*a* may be grounded. While the positive voltage is applied to the digit line 335-*a* and while the plate line 340-*a* is grounded, the word line 310-*a*-1 may be asserted, which may result in a negative write pulse across the memory cell 345-*a*. Although a first voltage (e.g., VSS, ground) is described as being applied to the plate lines 340 or the digit lines 335 during a write operation, a different voltage may be applied to write a logic "1" or a logic "0" to a memory cell 345. For example, a logic "0" may be written to a memory cell 345 by applying a write pulse having a positive polarity and a logic "1" may be written to a memory cell 345 by applying a write pulse having a negative polarity. That is, a logic "0" may be written to a memory cell 345 when a voltage of a plate line 340 is greater than (e.g., by at least a threshold voltage) a voltage of a digit line 335 associated with the memory cell 345, and a logic "1" may be written to a memory cell 345 when a voltage of the plate line 340 is less than (e.g., by at least a threshold voltage) a voltage of a digit line 335 associated with the memory cell 345.

In some instances, however, it may be desirable to perform a force write operation on some memory cells, such as the memory cell 345-*a*. For example, a force write operation may be performed on one or more memory cells 345, and the memory cells 345 having previously stored a logic "1" state may be reset (e.g., based on the voltages applied to the word lines 310, digit lines 335, and plate lines 340). As described herein, it may be desirable to reset some memory cells 345 upon an associated memory device transitioning power states (e.g., powering on or powering off).

To perform a force write operation, a first logic state (e.g., a logic "0") may be written to some memory cells 345 by grounding one or more digit lines 335 while driving a plate line 340 and one or more word lines to a same voltage value. For example, to perform a force write operation on the memory cell 345-*a*, the digit line 335-*a* may be grounded (e.g., a first voltage (VSS) may be applied to the digit line 335-*a*) and the plate line 340-*a* may be driven to a second voltage (e.g., VDD1). The word line 310-*a*-1 may then be asserted (e.g., the word line 310-*a*-1 may be driven to VDD1), and a write pulse may be applied to the memory cell 345-*a*, which may result in a logic "0" state being written to the memory cell.

In some examples, it may be desirable to force write (e.g., write a logic "0") enough memory cells as to disrupt an error correction operation (e.g., an error correcting code (ECC) operation). ECC operations may be performed on a word line basis, thus writing a logic "0" to at least a subset of memory cells 345 of each word line 310 may effectively reset enough memory cells as to disrupt the ECC operation, which may reduce the likelihood of security threats to data stored by the memory device due to sensitive data being present subsequent to a power off event. For example, an ECC may be performed on data stored in the memory cells 345 that may be able to correct K bit errors per codeword, where one codeword may be stored per row of memory cells 345. Thus, to disrupt the ECC, at least a threshold (e.g., 2K+1, 3K, 4K) of memory cells 345 from each row may be programmed during the bulk reset to disrupt the ECC for at least most or almost all codewords. Once more than K bit errors are introduced by the bulk reset operation, the ECC may introduce additional bit errors, making the original data unrecoverable. In some cases, the ECC used may be a non-systematic code (e.g., the codeword does not contain the input symbols), which may reduce the likelihood of recovering any portions of the original data after the bulk reset operation.

To write a logic "0" to a subset of memory cells 345 of each word line 310, a subset of digit lines 335 may be grounded and one or more corresponding plate lines 340 may be driven to a second voltage (e.g., VDD1). The word lines 310 of each word line group 305 may be selected sequentially until all word line groups 305 have been asserted. Accordingly, multiple memory cells 345 may be reset (e.g., force reset) during a single bulk reset operation.

Additionally or alternatively, other memory cells (such as the memory cells associated with the second plate group 350-*b*) may be force written during a subsequent duration. For example, each word line group 305 may be asserted sequentially while a subset of digit lines 335 is driven to VSS and another subset of digit lines 335 is driven to VDD1. Asserting the word lines 310 of each word line group 305 may result in a subset of memory cells 345 coupled with each word line 310 being programmed. In some examples, a force write operation as described herein may be a same or different operation on power down and power up. For example, on power down, memory cells 345 associated with a first plate group 350-*a* may be programmed, and on power up the memory cells 345 of the first plate group 350-*a* or the second plate group 350-*b* may be programmed. Utilizing different operations on power down and power up may allow for a subset of memory cells 345 of each word line 310 to be programmed in case the force write operation is not finished when the memory device powers down, while offering further protection if the force write operation performed when the memory device powers down does complete. Accordingly, performing a bulk reset operation on a subset of memory cells 345 may reduce the likelihood of security threats to data stored by an associated memory device due to sensitive data being present subsequent to a power off event.

Figure 4:
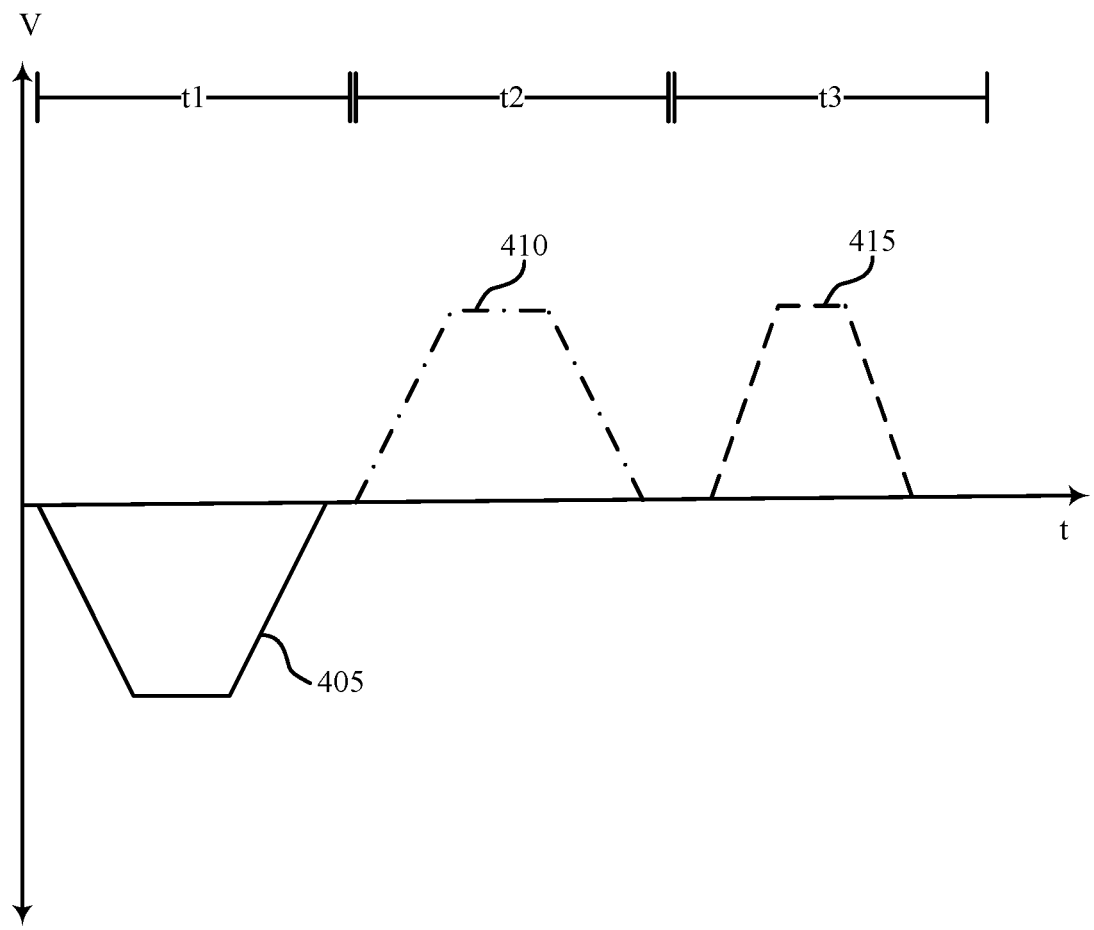
FIG. 4 illustrates an example of a timing diagram that supports cell data bulk reset in accordance with examples as disclosed herein.

FIG. 4 illustrates an example of a timing diagram 400 that supports cell data bulk reset in accordance with examples as disclosed herein. In some examples, the timing diagram 400 may illustrate the pulses (e.g., write pulses) applied to a first memory cell and a second memory cell during a write operation (e.g., a normal write operation) and a force write operation. For example, the timing diagram 400 may illustrate a write operation performed on a first memory cell (e.g., a memory cell 345-a as described with reference to FIG. 3), a second memory cell (e.g., a memory cell 345-b as described with reference to FIG. 3), followed by a force write operation performed on a subset of memory cells that includes at least the first memory cell and the second memory cell.

The force write operation may illustrate a logic state (e.g., a first logic state, a logic "0") being written to a memory cell upon an associated memory device transitioning power states. For example, the first logic state may be written to the subset of memory cells 345 upon the memory device powering on or powering off. Because the memory cells 345 may be non-volatile memory cells and be configured to store data when powered off, force writing a first logic state to the memory cells 345 may reduce the likelihood of security threats to data stored in the memory device due to otherwise valid data being present after the memory device has been powered off.

For exemplary purposes only, the timing diagram 400 may illustrate a write operation performed on a memory cell 345-a, followed by a write operation performed on a second memory cell 345-b as described with reference to FIG. 3. That is, during intervals t1 and t2, a normal write operation (e.g., a write operation resulting from receiving a command to perform a write operation on memory cells associated with the word line 310-a-1) may be performed. The write normal write operation that occurs during intervals t1 and t2 may be followed by a force write operation, during t3, that is performed on a subset of memory cells that includes at least the first memory cell 345-a and the second memory cell 345-b. As described herein, write operations and force write operations may be performed on a subset of memory cells of a memory array. For example, as described with reference to FIG. 3, write operations and force write operations may be performed (e.g., performed sequentially or simultaneously) on the memory cells of one or more word line groups 305 or one or more plate groups 350 during an interval. Thus, during the intervals t1, t2, and t3 a write operation or force write operation may be performed on multiple memory cells (e.g., multiple memory cells of a subset of memory cells) sequentially or simultaneously.

During t1, a negative write pulse 405 may be applied to the memory cell 345-a, which may result in a logic "1" being written to the memory cell 345-a. The negative write pulse 405 may be applied by applying a positive voltage (e.g., VDD) to the digit line 335-a and the plate line may be grounded. While the positive voltage is applied to the digit line 335-a and while the plate line 340-a is grounded, the word line 310-a-1 may be asserted, which may result in a negative write pulse across the memory cell 345-a.

In some instances, the negative write pulse 405 may be applied to one or more memory cells sequentially or simultaneously (e.g., during t1). For example, the first memory cell 345-a may be written to a logic "1" during t1. To write the memory cell 345-a, a positive voltage may be applied to the digit line 335 and the plate line 340-a may be driven to a low voltage (e.g., VSS, a voltage lower than VSS). Moreover, the word line 310-a-1 may be asserted, which may result in the negative write pulse 405 being applied to the memory cell 345-a. While the memory cell 345-a is being written, word lines 310 that are not asserted may be grounded (e.g., driven to the first voltage (VSS)).

During t2, a positive write pulse 410 may be applied to the memory cell 345-b. Applying the positive write pulse 410 to the memory cell 345-b may result in a logic "0" being written to the memory cell 345-b. The positive write pulse 410 may be applied by applying a positive voltage (e.g., VMPL) to the plate line 340-a and the digit line 335-a may be grounded. While the positive voltage is applied to the plate line 340-a and while the digit line 335-a is grounded, the word line 310-a-1 may again be asserted, which may result in a positive write pulse across the memory cell 345-b.

In some instances, the negative write pulse 405 and positive write pulse 410 may each be applied to multiple memory cells simultaneously (e.g., within the durations t1 and t2). For example, multiple memory cells 345 associated with the first word line 310-a-1 may be written to a logic "1" during t1, followed by multiple memory cells 345 associated with the word line 310-a-1 being written to a logic "0" during t2.

After a logic state is written to one or more memory cells 345 during t1 and t2, the memory device may transition power states. For example, the memory device may receive a command or signaling (e.g., from a host device, a local controller, or the like) to power off. Thus, during t3, the memory device may perform a force write operation on one or more memory cells before the associated memory device powers off. Although the following example is described as occurring before an associated memory device powers off, in some examples a force write operation may occur upon an associated memory device powering on (that is, t3 may occur after power on).

During t3, a force write operation may occur on one or more memory cells, such as the memory cells 345-a, 345-b, and 345-e, to perform a "bulk reset." A bulk reset operation may be performed on a set of memory cells, and a subset of the set of memory cells may be programmed to a logic "0." That is, the force write pulse may be applied to each of the set of memory cells, and memory cells that have previously been programmed to a logic "1" state may be programmed to the logic "0" state while memory cells that have previously been programmed to the logic "0" state may remain in the logic "0" state. To perform a force write operation, a positive write pulse 415 may be applied to the memory cells 345-a, 345-b, and 345-e, which may result in a logic "0" being written to the memory cells. In some examples, as described herein, the positive write pulse 405 may be applied to a subset of memory cells 345 associated with word lines 310 of the first word line group 305-a. For example, the positive write pulse 405 may be applied by grounding the digit lines 335-a and 335-b and driving the plate line 340-a to a second voltage (e.g., VDD1). While the plate line 340-a is driven to the second voltage and while the digit lines 335-a and 335-b are grounded, the word lines 310-a may be asserted (e.g., the word lines 310-a may be driven to the second voltage), which may result in a logic "0" state to be written to memory cells 345-a, 345-b, and 345-e. In some cases, memory cells 345-a and 345-e may have previously been written to a logic "1" state while memory cell 345-b may have previously been written to a logic "0" state. Thus, memory cells 345-a and 345-e may be programmed to the logic "0" state by the positive write pulse 405, while memory cell 345-b remains programmed to the logic "0" (e.g., the positive write pulse 405 may not change the state of memory cell 345-b). The force write operation may reduce the likelihood of security threats to data stored by an associated memory device due to sensitive data being present subsequent to a power off event.

The positive write pulse 415 (e.g., the force write pulse 415) may be applied to a subset of memory cells associated with the first word line group 305-a. For example, a first portion of memory cells 345 associated with the first word line group 305-a may be written (e.g., force written) to a logic "0" during t3 while a second portion of memory cells 345 associated with the first word line group 305-a may not be written. To force write the first portion of memory cells 345, one or more digit lines 335 associated with the plate group 350-a may be grounded and the plate line 340-a may be driven to VDD1. In contrast, the digit lines 335 associated with the plate group 350-b may be driven to a same voltage as the plate line 340-b (e.g., VSS or VDD1). Thus, when the word lines 310-a are asserted, the positive write pulse 415 may be applied to the memory cells 345 associated with the first word line group 305-a and the first plate group 350-a while no write pulse is applied to the memory cells 345 associated with the first word line group 305-a and the second plate group 350-b. While the memory cells 345 of the first word line group 305-a are being force written, the word lines associated with the second word line group 305-b and the third word line group 305-c may be unselected.

In some examples, it may be beneficial to program a subset of the memory cells 345 associated with the first plate group 350-a by sequentially performing a force write on the word line groups 305-a through 305-c while the digit lines 335-c and 335-d are at a same voltage as the plate line 340-b. For example, because programming memory cells 345 utilizes current, it may be beneficial to minimize the amount of current utilized after power is removed from the memory device. Limiting the current draw in any one force write operation may allow for multiple operations (e.g., multiple force write operations) to be performed sequentially without having a relatively high power draw. In some instances, after writing or force writing the memory cells associated with the first word line group 305-a and the first plate group 350-a, memory cells associated with the second plate group 350-b or the second word line group 305-b may be written or force written. That is, to write or force write the memory cells associated with the second plate group 350-b, the plate line 340-b and associated digit lines 335 may be driven to respective values and the word lines 310 may be asserted to write (or force write) one or more memory cells.

Additionally or alternatively, to write or force write the memory cells associated with the second word line group 305-b, the plate line 340-a and associated digit lines 335 may be driven to respective values and the word lines 315 may be asserted to write (or force write) one or more memory cells. Although a finite quantity of word line groups 305 and plate groups 350 are illustrated and described herein, a memory device may include any quantity of word line groups 305 and plate groups, and thus a force write operation may be performed on any quantity of word line groups 305 and plate groups 350. In addition, although a bulk reset operation is described by force writing a set of memory cells to a logic "0" state, the bulk reset operation may also force write the set of memory cells to a logic "1" state by reversing the polarity across the memory cells that are force written. Performing a force write operation upon an associated memory device transitioning power states, as described herein, may reduce the likelihood of security threats to data stored by an associated memory device due to sensitive data being present subsequent to a power off event.

Figure 5:
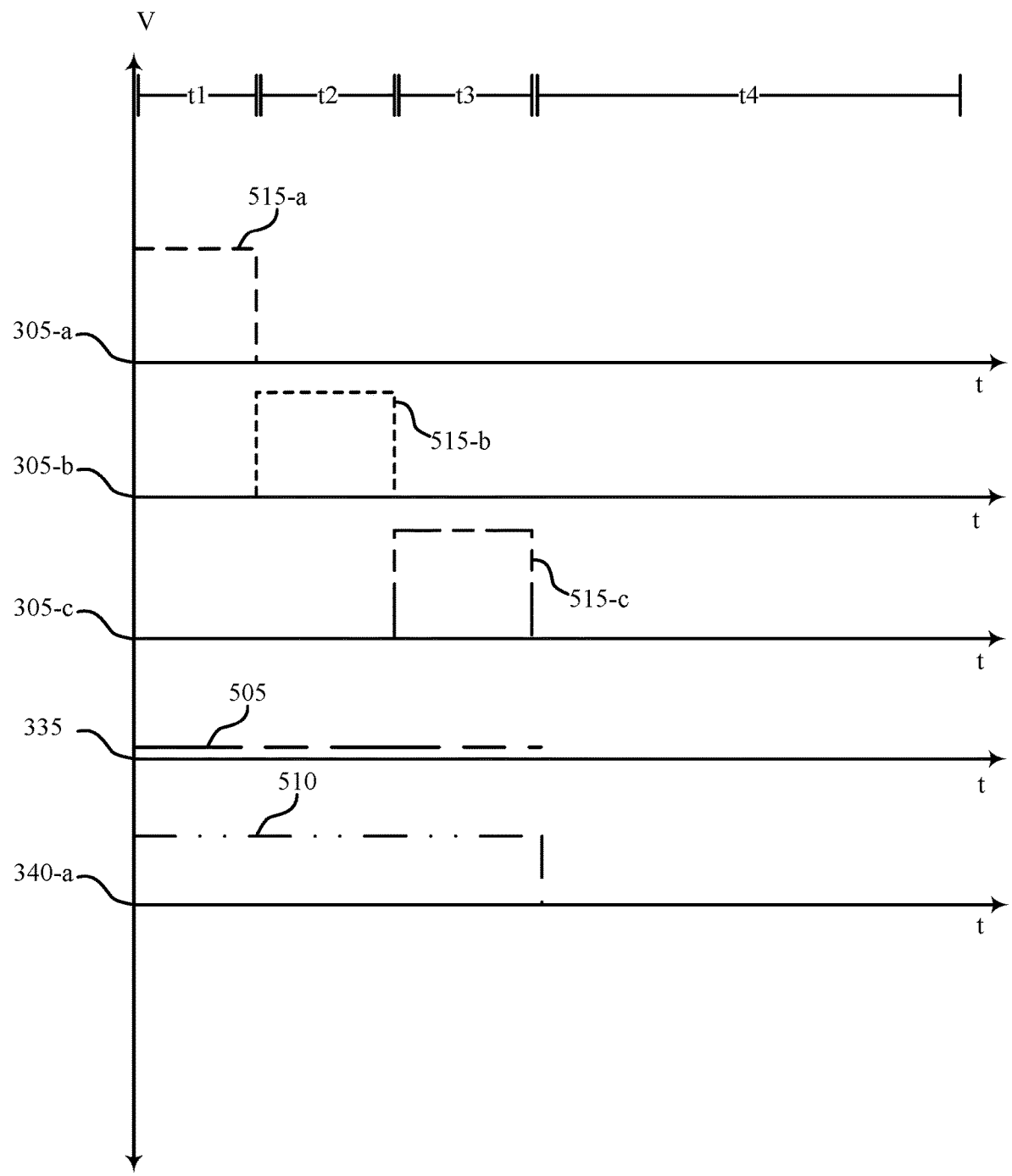
FIG. 5 illustrates an example of a timing diagram that supports cell data bulk reset in accordance with examples as disclosed herein.

FIG. 5 illustrates an example of a timing diagram 500 that supports cell data bulk reset in accordance with examples as disclosed herein. In some examples, the timing diagram 500 may illustrate the voltages of one or more word lines, one or more digit lines, and one or more plate lines during a force write operation. For example, the timing diagram 500 may illustrate a voltage applied to the word lines of a first word line group 305-a, a second word line group 305-b, and a third word line group 305-c as described with reference to FIG. 3. Moreover, the timing diagram 500 may illustrate a voltage applied to a digit line 335-a and a plate line 340-a as described with reference to FIG. 3. The force write operation illustrated by the voltages applied to the word lines, digit line, and plate line may result in a logic state (e.g., a first logic state, a logic "0") being written to a subset of memory cells upon an associated memory device transitioning power states. For example, the first logic state may be written to a subset of memory cells upon the memory device powering on or powering off.

For exemplary purposes only, the timing diagram 500 may illustrate a force write operation performed on a subset of memory cells that are associated with the first word line group 305-a, the second word line group 305-b, and the third word line group 305-c, and the digit line 335-a as described with reference to FIG. 3. However, in other examples, a force write operation may be performed on any subset of memory cells associated with the word line groups 305 or plate groups 350. Moreover, a force write operation may be performed on one or more decks of memory cells. In some examples, one or more word lines associated with a word line group 305 or one or more digit lines 335 associated with a plate group 350 may be asserted sequentially or simultaneously, which may write a first logic state to a particular subset of memory cells of a memory array. Thus, although the intervals t1 through t4 illustrate a force write operation performed on a subset of memory cells that are associated with the first word line group 305-a, the second word line group 305-b, and the third word line group 305-c, and the digit line 335-a as described with reference to FIG. 3, different subsets of memory cells may undergo a force write operation during the same or similar intervals.

During t1, a voltage 505 (e.g., VSS) may be applied to one or more digit lines. For example, the voltage 505 may be applied to the digit line 335-a and the digit line 335-b, and a voltage 510 (e.g., VDD1) may be applied to the plate line 340-a. In some instances, the voltage 505 may be applied to the digit line 335-a during each of the intervals t1 through t3, and the voltage 510 may be applied to the plate line 340-a during each of the intervals t1 through t3. That is, the voltage 505 may be continually applied to the digit line 335-a through at least the interval t3 and the voltage 510 may be continually applied to the plate line 340-a through at least the interval t3.

While the voltage 505 is applied to the digit lines 335 and the voltage 510 is applied to the plate line 340-a, a first write pulse 515-a may be applied to the memory cells associated with the first word line group 305-a. The first write pulse 515-a may be applied by driving the word lines 310-a to VDD1 during duration t1. Applying the first write pulse 515-a may result in a positive write pulse being applied to the memory cell 345-a (and the other memory cells coupled with the digit lines 335-a and 335-b and the word lines of the first word line group 305-a), which may result in a logic "0" being written to the respective memory cells. In some instances, the pulse applied to the word lines of the first word line group 305-a may be shorter than a pulse applied to the word lines during a normal write operation.

During t2, a second write pulse 515-b may be applied to the memory cells associated with the second word line group 305-b. The second write pulse 515-b may be applied based on driving the word lines 310-b to VDD1 during t2. Applying the second write pulse 515-b may result in a positive write pulse being applied memory cells at the intersection of the word lines included in the second word line group 305-b, and the digit lines 335-a and 335-b, which may result in a logic "0" being written to the respective memory cells. For example, applying the second write pulse 515-b may result in a positive pulse being applied to the respective memory cells because the plate line 340-a may remain driven to a same voltage (e.g., VDD1) and the digit lines 335 may remain grounded during t2. In some instances, the pulse applied to the word lines of the word line group 305-b may be shorter than a pulse applied to the word lines during a normal write operation.

During t3, a third write pulse 515-c may be applied to the memory cells associated with the third word line group 305-c. The third write pulse 515-c may be applied based on driving the word lines 310-c to VDD1 during t3. Applying the third write pulse 515-c may result in a positive write pulse being applied memory cells at the intersection of the word lines included in the third word line group 305-c, and the digit lines 335-a and 335-b, which may result in a logic "0" being written to the respective memory cells. For example, applying the third write pulse 515-c may result in a positive pulse being applied to the respective memory cells because the plate line 340-a may remain driven to a same voltage (e.g., VDD1) and the digit lines 335 may remain grounded during t3. In some instances, the pulse applied to the word lines of the word line group 305-c may be shorter than a pulse applied to the word lines during a normal write operation.

Upon performing the force write operation on the memory cells during t3, the digit lines 335 may no longer be driven to VSS and the plate line 340-a may no longer be driven to VDD1. That is, the digit lines 335 and the plate line 340-a may be left floating or driven to another voltage during t4 and subsequent intervals. As a first example (not shown), during t4 and subsequent intervals, a force write operation may be performed on a subset of memory cells associated with the second plate group 350-b. During such an operation, the digit lines 335-c and 335-d may be driven to VSS and the plate line 340-b may be driven to VDD1 and the word lines associated with the first word line group 305-a may be asserted as described herein.

Figure 6:
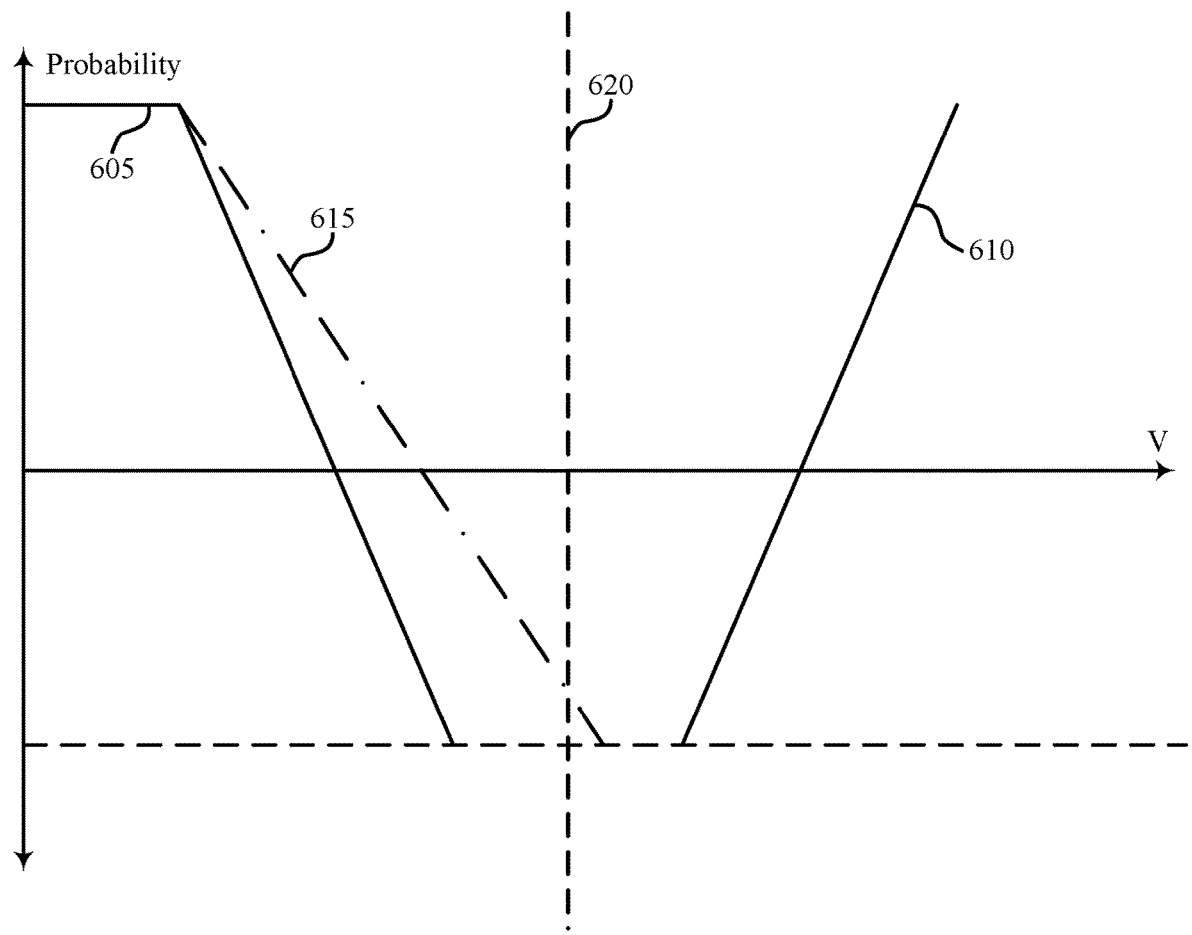
FIG. 6 illustrates an example of a plot of a voltage distribution of a memory cell that supports cell data bulk reset in accordance with examples as disclosed herein.

FIG. 6 illustrates an example of a plot 600 of a voltage distribution of a memory cell that supports cell data bulk reset in accordance with examples as disclosed herein. In some examples, the plot 600 may illustrate the voltage distribution of memory cells written to a first logic state and a second logic state (e.g., as a result of normal write operations). The plot 600 may also illustrate the voltage distribution of the memory cells having undergone a force write operation (e.g., the voltage distribution of memory cells previously written to a logic "1" state and having undergone a force write).

The memory cells having undergone a force write operation may be examples of the memory cells 345 as described with reference to FIG. 3 and the force write operation may be performed as described herein. For example, a force write operation may be performed on a subset of memory cells 345 associated with each word line group 305 upon the memory device powering on or powering off. Because the memory cells 345 may be non-volatile memory cells and be configured to store data when powered off, performing a bulk reset operation may reduce the likelihood of security threats to data stored by an associated memory device due to sensitive data being present subsequent to a power off event.

A first distribution 605 may represent the distribution of memory cells of an array having been written to a first logic state (e.g., a logic "0") during a write operation (e.g., a normal write operation). As described with reference to FIG. 4, a first logic state may be written to a memory cell by applying a positive write pulse to the respective memory cells. The positive write pulse may be applied by applying a positive voltage (e.g., VMPL) to a plate line and grounding a digit line. While the positive voltage is applied to the plate line and while the digit line is grounded, a word line may be asserted, which may result in a logic "0" being written to the associated memory cell.

A second distribution 610 may represent the distribution of memory cells of an array having been written to a second logic state (e.g., a logic "1") during a write operation (e.g., a normal write operation). As described with reference to FIG. 4, a second logic state may be written to a memory cell by applying a negative write pulse. The negative write pulse may be applied by applying a positive voltage (e.g., VDD) to a digit line and applying a lower voltage (e.g., VSS, a negative voltage) to a plate line. While the positive voltage is applied to the digit line and while the plate line is at the lower voltage, a word line may be asserted, which may result in a logic "1" being written to the associated memory cell.

A third distribution 615 may represent the distribution of a subset of memory cells having undergone a force write operation. As described herein, the third distribution 615 may result from applying a positive write pulse to a set of memory cells of the memory device as described with reference to FIG. 3. The force write operation may be performed on all memory cells of the set of memory cells, however the third distribution 615 may represent the distribution of memory cells having previously stored a logic "1" state. Because the pulse applied to the memory cells during a force write operation may be shorter than a write pulse applied during an access operation (e.g., a normal write operation), all of the set of memory cells may not fully transition to a logic "0" state. For example, at least a part of the third distribution 615 may not be below a threshold 620 that is used to detect memory cells storing the logic "0" state. However, the force write operation may affect the distribution of enough memory cells (e.g., enough memory cells having previously been programmed to a logic "1" state) as to create uncertainty of the codeword that is produced during an error correction procedure. For example, it may be desirable to force write (e.g., write a logic "0") state to enough memory cells as to disturb an error correction operation. Accordingly, the force write operation may reduce the likelihood of security threats to data stored by an associated memory device due to sensitive data being present subsequent to a power off event.

Figure 7:
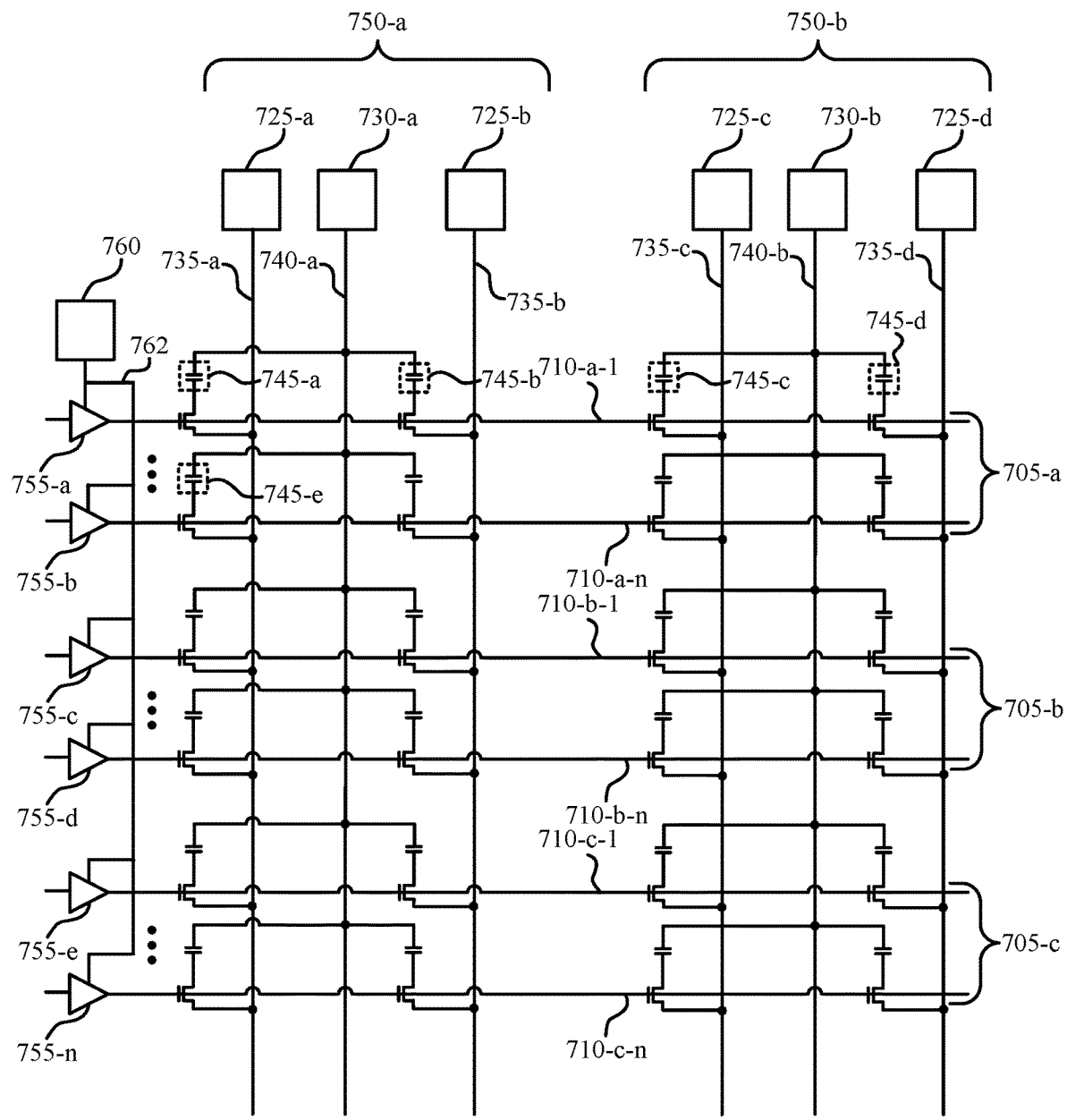
FIG. 7 illustrates an example of a circuit diagram that supports cell data bulk reset in accordance with examples as disclosed herein.

FIG. 7 illustrates an example of a circuit diagram 700 that supports cell data bulk reset in accordance with examples as disclosed herein. The circuit diagram 700 may illustrate aspects of an array of non-volatile memory cells 745. For example, the circuit diagram 700 may illustrate non-volatile memory cells 745 that are each coupled with a word line of a word line group 705, a digit line 735, and a plate line 740. The circuit diagram 700 may also illustrate drivers 725, which may be coupled with respective digit lines 735 and drivers 730, which may be coupled with respective plate lines. The word lines 710 of each word line group 705 may also be coupled with respective drivers 755.

Each driver may be coupled with one or more voltage sources and may be configured to drive a respective line (e.g., a digit line 735, a plate line 740, or a word line 710) based on a voltage source coupled with the driver. For example, drivers may be coupled with one or more of a first voltage source (e.g., VSS), a second voltage source (e.g., VDD1), or a third voltage source (e.g., VMPL). In some instances, either an access operation (e.g., a write operation) or a force write operation (e.g., a bulk reset operation) may be performed on memory cells 745 based on the drivers driving respective lines to respective voltages.

The circuit diagram may illustrate an array of non-volatile memory cells 745. In some examples, each memory cell 745 may be coupled with a word line of a respective word line group 705. For example, the first word line group 705-a may include word lines 705-a-1 through 705-a-n, where n represents a positive integer. Each word line 710 may be coupled with a driver 755 (e.g., a respective driver 755) that is coupled with a voltage source 760. In some examples, the voltage source 760 may provide a second voltage (e.g., VDD1) to the drivers 755 via supply node 762. In some examples, the voltage source 760 may be an example of a current driver and the drivers 755 may be configured to drive a respective word line (e.g., a word line 710-a) based on an input signal, as well as drive a respective word line to a first voltage (e.g., VSS) or a second voltage (e.g., VDD1).

In some instances, each word line group 705 may be configured similarly. For example, the second word line group 705-b may include word lines 710-b-1 through 710-b-n and the third word line group 705-c may include word lines 705-c-1 through 705-c-n, where n represents a positive integer. Each word line 710-b may be coupled with a driver (e.g., a respective driver). During an access operation (e.g., a normal write operation), a single word line 710 of a word line group 705 may be selected at a time. Conversely, during a bulk reset operation (e.g., during a force write operation), an entire word line group 705 may be selected at a time. For example, the word lines 710-a of the first word line group 705-a may be selected by a row decoder (e.g., by a row decoder 225 as described with reference to FIG. 2) while the word lines 710-b of the second word line group 705-b and the word lines 710-c of the third word line group 705-c are unselected. Thus, during a force write operation, one or more word lines 710-a may be driven to a second voltage (e.g., VDD1) while the word lines of the second word line group 705-b and the third word line group 705-c are unselected.

The memory cells 745 of each word line group 705 may be coupled with one or more digit lines 735. For example, the digit line 735-a may be coupled with memory cells 745 (e.g., a subset of memory cells 745) from each word line group 705. That is, the digit line 735-a may be coupled with memory cells 745 located at the intersection of each word line of each word line group 705. Similarly, the digit line 735-b may be coupled with memory cells 745 located at the intersection of each word line of each word line group 705. In some instances, the digit line 735-a and the digit line 735-b may be coupled with the drivers 725-a and 725-b, respectively. The drivers 725-a and 725-b may be coupled with at least a first voltage source and may be configured to each apply a same voltage to the digit lines 735-a and 735-b. For example, the drivers 725 may each be configured to apply a first voltage (e.g., VSS) to the digit lines 735 during a bulk reset operation.

The memory cells 745 of each word line group 705 may be coupled with at least one plate line 740 from a respective plate group 750. For example, the memory cells 745-a and 745-b may be coupled with a plate line 740-a from the plate group 750-a (e.g., the plate line 740-a may be coupled with a first plate). Similarly, the memory cells 745-c and 745-d may be coupled with a plate line 740-b from the plate group 750-b (e.g., the plate line 740-b may be coupled with a second plate). In some instances, the plate line 740-a and the plate line 740-b may be coupled with drivers 730-a and 730-b, respectively.

During a standard write operation, the drivers 730-a and 730-b may couple the plate lines 740-a and 740-b with a voltage source (e.g., VMPL) for programming memory cells 745 to a first logic state (e.g., a logic "0"). Moreover, the drivers 730-a and 730-b may couple the plate lines 740-a and 740-b with a different voltage source (e.g., VSS) for programming memory cells 745 to a second logic state (e.g., a logic "1"). As described herein, VMPL may be a same or a different voltage as VDD1. In the instances where VMPL is a different voltage than VDD1, during a bulk reset operation the drivers 330-a and 330-b may couple the plate lines 340-a and 340-b to VDD1 as it may retain a higher voltage longer than VMPL. In other examples, VDD1 may be more robust than VMPL due to VMPL being generated on-chip (e.g., on-die) using a charge pump, which may result in VMPL not being able to supply enough current for a bulk reset operation.

During a bulk reset operation, the drivers 730-a and 730-b may be configured to each apply a same voltage to the plate lines 740-a and 740-b. For example, during the bulk reset operation, the drivers 730 may each be configured to apply a second voltage (e.g., VDD1) to the plate lines 740. In some instances, VDD1 and VMPL may each be referred to as a "second voltage" and thus may each represent a same or similar voltage applied to the word lines and plate lines 740. During other operations, such as an access operation, the drivers 730-a and 730-b may be coupled with a different voltage source and may be configured to drive the plate lines 740-a and 740-b to VMPL.

As described herein, each word line in each word line group 705 may be coupled with a respective driver 755. In some instances, the drivers 755 may each include a pull-up transistor (e.g., a PMOS transistor) configured to couple the voltage source 760 with a respective word line 710 when the word line 710 is selected. For example, the drivers 755 may be inverters (or may each include more than one inverter) where the pull-up transistor of the final stage inverter has a source coupled with the voltage source 760 and a drain coupled with the respective word line 710. Accordingly, when an input to the inverter is low (e.g., when the word line 710 is selected), the transistor may couple the supply node 762 to the respective word line 710. Each word line group 705 may include n word lines and n drivers, where n is a positive integer. In some instances, each of the drivers 755 may have a relatively low impedance, such that coupling multiple word lines 710 to the voltage source 760 may be used to share charge across word lines 710.

For example, the drivers 755 may drive the word lines of the first word line group 705-a to a second voltage (e.g., VDD1). While the word lines included in the first word line group 705-a are driven to VDD1, the pull-up transistors in the drivers 755 of the second word line group 705-*b* may also be enabled, coupling the word lines 710 of the first word line group 705-*a* to the word lines 710 of the second word line group 705-*b* via the supply node 762. Thus, charge may be shared between the word lines 710 included in the first word line group 705-*a* and the word lines 710 included in the second word line group 705-*b*. As the charge is shared, the voltage of the word lines 710 included in the first word line group 705-*a* may be reduced from VDD1 to an intermediate voltage while a voltage of the word lines included in the second word line group 705-*b* may be increased from VSS to the intermediate voltage. Accordingly, the amount of charge supplied by the voltage source 760 for the drivers of the second word line group 705-*b* to drive the word lines 710 of the second word line group 705-*b* from the intermediate voltage to VDD1 may be less (e.g., approximately half) of the charge needed to drive the word lines 710 from VSS to VDD. The memory device may thus save power in performing the bulk reset operation.

By way of example, the word lines included in the first word line group 705-*a* may be driven to VDD1 for a first duration in order to perform a force write operation on a subset of the memory cells associated with the first word line group 705-*a*. Subsequently, the word lines included in the second word line group 705-*b* may be selected (e.g., by a row decoder 225 as described with reference to FIG. 2) while the word lines included in the first word line group 705-*a* remain driven to VDD1. The transistors (e.g., the PMOS) transistors included in the drivers of the first word line group 705-*a* and the second word line group 705-*b* may effective couple the word lines included in the first word line group 705-*a* with the word lines included in the second word line group 705-*b*. While the word lines are coupled, the voltage source 760 may be on or off (e.g., activated or deactivated). If on, the voltage source 760 may supply charge to the word lines, but not enough charge to rapidly pull up the word lines included in the second word line group 705-*b* to VDD1. Alternatively, if the voltage source 760 is off while the word lines are coupled together, the charge from the word lines included in the first word line group 705-*a* may be shared with the word lines included in the second word line group 705-*b* without additional charge being added from the voltage source 760, and the word lines included in the second word line group 705-*b* may be pulled up to an intermediate voltage based on the charge sharing. Turning off the voltage source 760 (e.g., decoupling supply node 762 from a VDD1 supply) while the charge is being shared between the word lines 710 of the first word line group 705-*a* and the word lines of the second word line group 705-*b* may save additional power as approximately half of the charge injected by the voltage source 760 during the time period that the charge is being shared may go to word lines 710 of the first word line group 705-*a*, which may then be subsequently lost when the word lines 710 of the first word line group 705-*a* are de-asserted.

Figure 8:
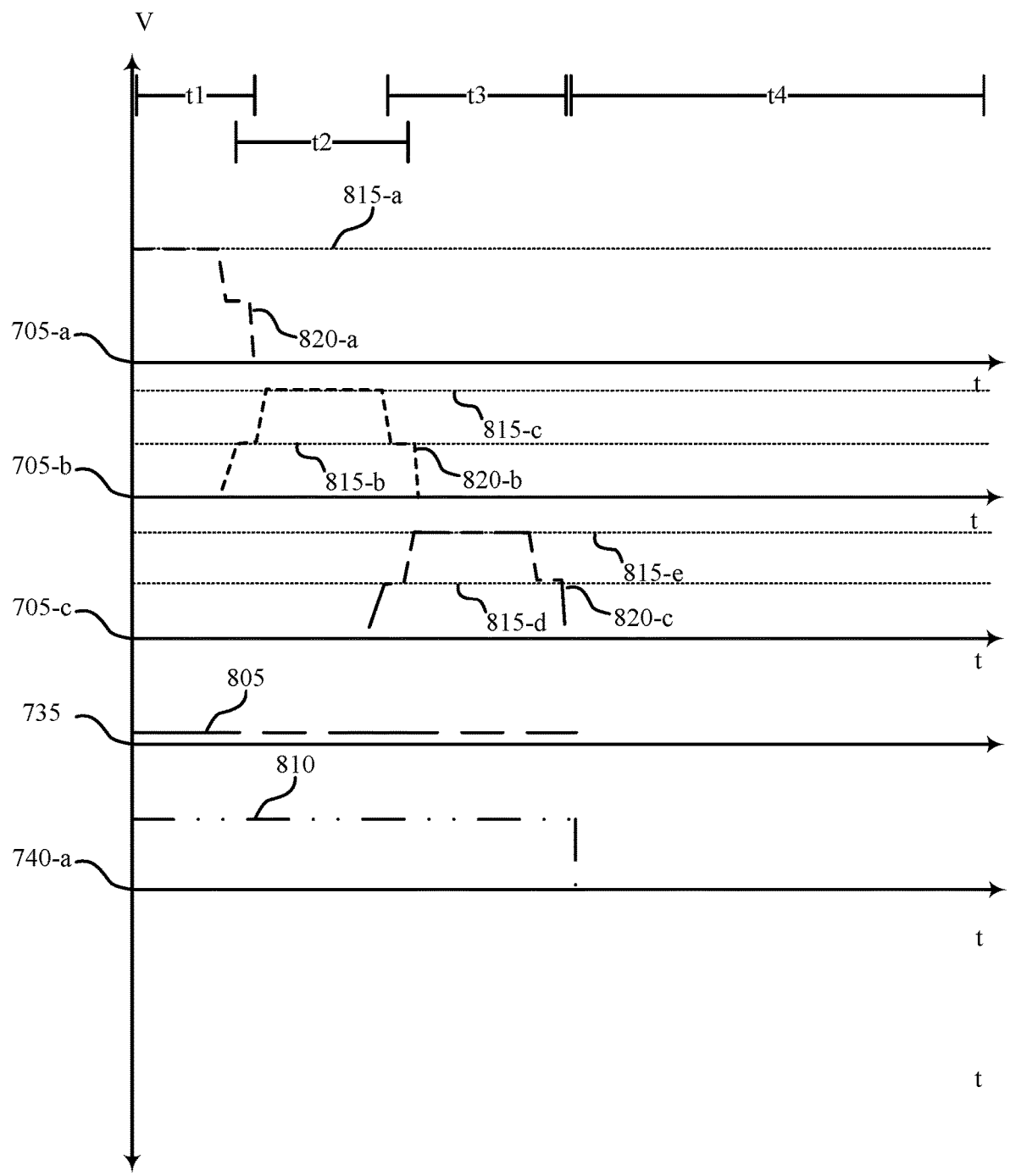
FIG. 8 illustrates an example of a timing diagram that supports cell data bulk reset in accordance with examples as disclosed herein.

FIG. 8 illustrates an example of a timing diagram 800 that supports cell data bulk reset in accordance with examples as disclosed herein. In some examples, the timing diagram 800 may illustrate the voltages of one or more word lines, one or more digit lines, and one or more plate lines during a force write operation. For example, the timing diagram 800 may illustrate a voltage applied to the word lines of a first word line group 705-*a*, a second word line group 705-*b*, and a third word line group 705-*c* as described with reference to FIG. 7.

Moreover, the timing diagram 800 may illustrate a voltage applied to a digit line 735-*a*, a digit line 735-*b*, and a plate line 740-*a* as described with reference to FIG. 7. The force write operation illustrated by the voltages applied to the word lines, digit line, and plate line may result in a logic state (e.g., a first logic state, a logic "0") being written to a subset of memory cells upon an associated memory device transitioning power states. For example, the first logic state may be written to the subset of memory cells 745 upon the memory device powering on or powering off. Because the memory cells 745 may be non-volatile memory cells and be configured to store data when powered off, force writing a first logic state to the memory cells 745 may reduce the likelihood of security threats to data stored by the memory device due to sensitive data being present subsequent to a power off event.

For exemplary purposes only, the timing diagram 800 may illustrate a force write operation performed on a subset of memory cells that are associated with the first word line group 705-*a*, the second word line group 705-*b*, the third word line group 705-*c*, and the digit lines 735-*a* and 735-*b* as described with reference to FIG. 7. However, in other examples, a force write operation may be performed on a subset of memory cells associated with the second plate group 750-*b*. Moreover, a force write operation may be performed on one or more decks of memory cells. In some examples, one or more word lines associated with a word line group 705 or one or more digit lines 735 associated with a plate group 750 may be asserted sequentially or simultaneously, which may write a first logic state to a particular subset of memory cells of a memory array. Thus, although the intervals t1 through t3 illustrate a force write operation performed on a subset of memory cells that are associated with the first word line group 705-*a*, the second word line group 705-*b*, the third word line group 705-*c*, and the digit lines 735-*a* and 735-*b* as described with reference to FIG. 7, different subsets of memory cells may undergo a force write operation during the same intervals.

During t1, a voltage 805 (e.g., VSS) may be applied to the digit lines 835 and a voltage 810 (e.g., VDD1) may be applied to the plate line 740-*a*. In some instances, the voltage 805 and the voltage 810 may be applied to the digit lines 735-*a* and 735-*b* and to the plate line 740-*a* during each of the intervals t1 through t3. That is, the voltage 805 and the voltage 810 may be continually applied to the digit line 735-*a* and to the plate line 740-*a* through at least the interval t3.

While the voltage 805 is applied to the digit lines 735 and the voltage 810 is applied to the plate line 740-*a*, the drivers 755 may be activated to apply a second voltage 815-*a* (e.g., VDD1) to the word lines included in the first word line group 705-*a*. Applying the second voltage 815-*a* to the first word line group 705-*a* may result in a positive write pulse 820-*a* being applied to the memory cell 745-*a* (and the other memory cells coupled with the digit lines 735-*a* and 735-*b* and the word lines of the first word line group 705-*a*), which may result in a logic "0" being written to the respective memory cells. In some instances, the pulse applied to the word lines of the first word line group 705-*a* may be shorter than a pulse applied to the word lines during a normal write operation.

Additionally or alternatively, during an overlapping portion of t1 and t2, charge may be shared between the word lines included in the first word line group 705-*a* and the word lines included in the second word line group 705-*b*. The charge may be shared due to the voltage source 760 having a non-zero impedance (or being turned off during the overlapping portion of t1 and t2) as described with reference to FIG. 7. Accordingly, the voltage of the word lines included in the second word line group 705-*b* may increase to an intermediate voltage 815-*b*, which may be a greater voltage than VSS but may be a lesser voltage than VDD1 (e.g., approximately halfway between VSS and VDD1). Similarly, the voltage of the word lines of the first word line group 705-*a* may decrease from VDD1 to the intermediate voltage 815-*b* as a result of sharing charge with the word lines of the second word line group 705-*b*. Once the word lines of the second word line group 705-*b* reach the intermediate voltage 815-*b*, the word lines of the first word line group 705-*a* may be de-asserted (e.g., decoupled from the supply node 762 and driven to VSS) at the end of t1.

After the word lines of the first word line group 705-*a* are decoupled from the supply node 762, the supply node 762 may be driven back to VDD1 by voltage source 760 and the drivers 755 coupled with the word lines included in the second word line group 705-*b* may continue to be activated to apply a second voltage 815-*c* (e.g., VDD1) to the word lines included in the second word line group 705-*b*. Because a voltage of the word lines may have been at the intermediate voltage 815-*b* due to charge sharing, the drivers may need only drive the word lines from the intermediate voltage 815-*b* to the second voltage 815-*c* instead of from VSS. Applying the second voltage 815-*c* to the word lines included in the second word line group 705-*b* may result in a positive write pulse 820-*b* being applied to a memory cell at the intersection of the word lines included in the second word line group 705-*b* and the digit lines 735-*a* and 735-*b*, which may result in a logic "0" being written to the respective memory cells. For example, applying the second voltage 815-*c* to the word lines may result in a positive pulse being applied to the memory cells because the digit lines 735 may remain grounded and the plate line 740-*a* may remain driven to VDD1 during t2.

Additionally or alternatively, during an overlapping portion of t2 and t3, charge may be shared between the word lines included in the second word line group 705-*b* and the word lines included in the third word line group 705-*c*. The charge may be shared due to the voltage source 760 having a non-zero impedance (or being turned off during the overlapping portion of t2 and t3) as described with reference to FIG. 7. Accordingly, the voltage of the word lines included in the third word line group 705-*c* may increase to an intermediate voltage 815-*d*, which may be a greater voltage than VSS but may be a lesser voltage than VDD1 (e.g., approximately halfway between VSS and VDD1). Similarly, the voltage of the word lines of the second word line group 705-*b* may decrease from VDD1 to the intermediate voltage 815-*d* as a result of sharing charge with the word lines of the third word line group 705-*c*. Once the word lines of the third word line group 705-*c* reach the intermediate voltage 815-*d*, the word lines of the second word line group 705-*b* may be de-asserted (e.g., decoupled from the supply node 762 and driven to VSS) at the end of t2.

After the word lines of the second word line group 705-*b* are decoupled from the supply node 762, the supply node 762 may be driven back to VDD1 by voltage source 760 and the drivers 755 coupled with the word lines included in the third word line group 705-*c* may continue to be activated to apply a second voltage 815-*e* (e.g., VDD1) to the word lines included in the third word line group 705-*c*. Because a voltage of the word lines may have been at the intermediate voltage 815-*d* due to charge sharing, the drivers may need only drive the word lines from the intermediate voltage 815-*d* to the second voltage 815-*e* instead of from VSS. Applying the second voltage 815-*e* to the word lines included in the third word line group 705-*c* may result in a positive write pulse 820-*c* being applied to a memory cell at the intersection of the word lines included in the third word line group 705-*c* and the digit lines 735-*a* and 735-*b*, which may result in a logic "0" being written to the respective memory cells. For example, applying the second voltage 815-*e* to the word lines may result in a positive pulse being applied to the memory cells because the digit lines 735 may remain grounded and the plate line 740-*a* may remain driven to VDD1 during t3.

Upon performing the force write operation on the memory cells during t3, the digit lines 735 may no longer be driven to VSS and the plate line 740-*a* may no longer be driven to VDD1. That is, the digit lines 735 and the plate line 740-*a* may be left floating or driven to another voltage during t4 and subsequent intervals. As a first example (not shown), during t4 and subsequent intervals, a force write operation may be performed on a subset of memory cells associated with the second plate group 750-*b*. During such an operation, the digit lines 735-*c* and 735-*d* may be driven to VSS and the plate line 740-*b* may be driven to VDD1 and the word lines associated with the first word line group 705-*a* may be asserted as described herein.

Figure 9:
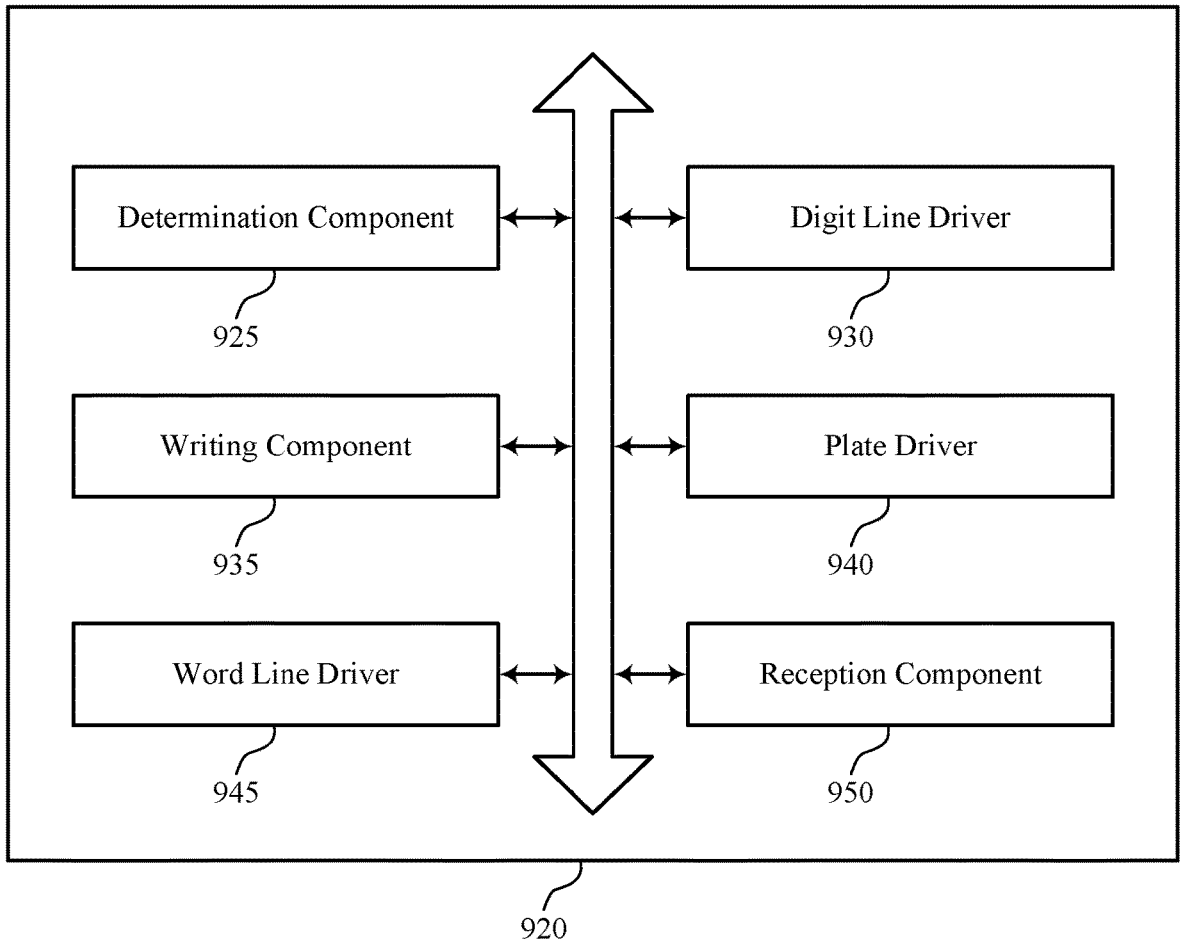
FIG. 9 shows a block diagram of a memory controller that supports cell data bulk reset in accordance with examples as disclosed herein.

FIG. 9 shows a block diagram 900 of a memory controller 920 that supports cell data bulk reset in accordance with examples as disclosed herein. The memory controller 920 may be an example of aspects of a memory controller as described with reference to FIGS. 1 through 8. The memory controller 920, or various components thereof, may be an example of means for performing various aspects of cell data bulk reset as described herein. For example, the memory controller 920 may include a determination component 925, a digit line driver 930, a writing component 935, a plate driver 940, a word line driver 945, a reception component 950, or any combination thereof. Each of these components may communicate, directly or indirectly, with one another (e.g., via one or more buses).

The determination component 925 may be configured as or otherwise support a means for determining, at a memory device including a plurality of non-volatile memory cells, a transition from a first power state to a second power state.

The digit line driver 930 may be configured as or otherwise support a means for driving a first subset of digit lines of the memory device to a first voltage and a first subset of word lines of the memory device to a second voltage based at least in part on the transition from the first power state to the second power state. In some examples, the digit line driver 930 may be configured as or otherwise support a means for driving a fourth subset of digit lines of the memory device to the second voltage based at least in part on driving the third subset of word lines to the first voltage.

The writing component 935 may be configured as or otherwise support a means for writing a first logic state to a subset of the plurality of non-volatile memory cells associated with the first subset of word lines and the first subset of digit lines based at least in part on driving the first subset of digit lines to the first voltage and the first subset of word lines to the second voltage. In some examples, the writing component 935 may be configured as or otherwise support a means for writing the first logic state to a second plurality of non-volatile memory cells associated with the third subset of word lines and the fourth subset of digit lines based at least in part on driving the fourth subset of digit lines of the memory device to the second voltage.

In some examples, the plate driver 940 may be configured as or otherwise support a means for driving a plate associated with the plurality of non-volatile memory cells to the second voltage based at least in part on driving the first subset of digit lines of the memory device to the first voltage, where writing the first logic state to the subset of the plurality of non-volatile memory cells associated with the first subset of word lines and the first subset of digit lines is based at least in part on driving the first subset of word lines and the plate to the second voltage. In some examples, the plate driver 940 may be configured as or otherwise support a means for driving a second plate associated with the second plurality of non-volatile memory cells to the first voltage based at least in part on driving the fourth subset of digit lines of the memory device to the second voltage, where writing the first logic state to the second plurality of non-volatile memory cells associated with the third subset of word lines and the fourth subset of digit lines is based at least in part on driving the third subset of word lines to the first voltage and the second plate to the first voltage.

In some examples, the word line driver 945 may be configured as or otherwise support a means for driving the first subset of word lines to a third voltage based at least in part on writing the first logic state to the plurality of non-volatile memory cells. In some examples, the word line driver 945 may be configured as or otherwise support a means for driving a third subset of word lines of the memory device to the first voltage.

In some examples, the reception component 950 may be configured as or otherwise support a means for receiving, at the memory device, a signal to transition the memory device from the first power state to the second power state, where driving the plate to the first voltage is based at least in part on receiving the signal to transition the memory device from the first power state to the second power state. In some examples, to support determining the transition from the first power state to the second power state, the reception component 950 may be configured as or otherwise support a means for receiving a command at the memory device, where the memory device transitions from the first power state to the second power state based at least in part on receiving the command.

In some examples, the plurality of non-volatile memory cells are associated with a first deck of non-volatile memory cells of the memory device and the second plurality of non-volatile memory cells is associated with a second deck of non-volatile memory cells of the memory device. In some examples, the first power state or the second power state corresponds to a powered-off state.

Figure 10:
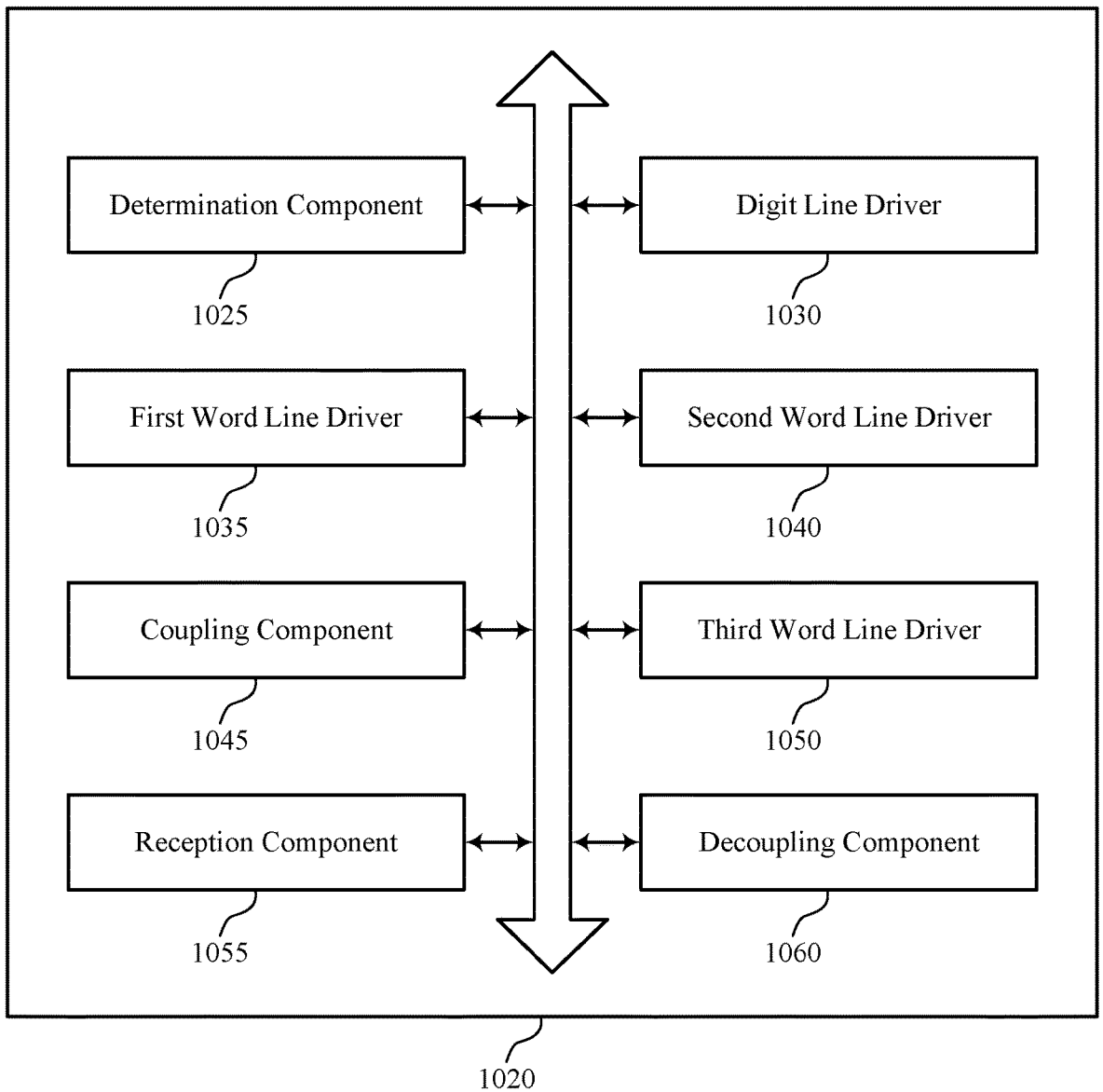
FIG. 10 shows a block diagram of a memory controller that supports cell data bulk reset in accordance with examples as disclosed herein.

FIG. 10 shows a block diagram 1000 of a memory controller 1020 that supports cell data bulk reset in accordance with examples as disclosed herein. The memory controller 1020 may be an example of aspects of a memory controller as described with reference to FIGS. 1 through 8. The memory controller 1020, or various components thereof, may be an example of means for performing various aspects of cell data bulk reset as described herein. For example, the memory controller 1020 may include a determination component 1025, a digit line driver 1030, a first word line driver 1035, a second word line driver 1040, a coupling component 1045, a third word line driver 1050, a reception component 1055, a decoupling component 1060, or any combination thereof. Each of these components may communicate, directly or indirectly, with one another (e.g., via one or more buses).

The determination component 1025 may be configured as or otherwise support a means for determining, at a memory device including a plurality of non-volatile memory cells, a transition from a first power state to a second power state.

The digit line driver 1030 may be configured as or otherwise support a means for driving a first subset of digit lines of the memory device to a first voltage based at least in part on the transition from the first power state to the second power state.

The first word line driver 1035 may be configured as or otherwise support a means for driving a first subset of word lines of the memory device to a second voltage while the first subset of digit lines are driven to the first voltage, where a first logic state is written to a first subset of the plurality of non-volatile memory cells of the memory device based at least in part on driving the first subset of word lines of the memory device to the second voltage. In some examples, the first word line driver 1035 may be configured as or otherwise support a means for sharing a charge of the first subset of word lines with a second subset of word lines of the memory device after driving the first subset of word lines to the second voltage. In some examples, the first word line driver 1035 may be configured as or otherwise support a means for driving the first subset of word lines to a third voltage after decoupling the first subset of word lines from the second subset of word lines.

The second word line driver 1040 may be configured as or otherwise support a means for driving the second subset of word lines to the second voltage based at least in part on sharing the charge of the first subset of word lines with the second subset of word lines, where the first logic state is written to a second subset of the plurality of non-volatile memory cells of the memory device based at least in part on driving the second subset of word lines of the memory device to the second voltage. In some examples, the second word line driver 1040 may be configured as or otherwise support a means for sharing a charge of the second subset of word lines with a third subset of word lines of the memory device after driving the second subset of word lines to the second voltage.

In some examples, to support sharing the charge of the first subset of word lines with the second subset of word lines, the coupling component 1045 may be configured as or otherwise support a means for coupling the first subset of word lines to the second subset of word lines after driving the first subset of word lines to the second voltage and before driving the second subset of word lines to the second voltage, where the charge is shared between the first subset of word lines and the second subset of word lines based at least in part on coupling the first subset of word lines to the second subset of word lines.

In some examples, the third word line driver 1050 may be configured as or otherwise support a means for driving the third subset of word lines to the second voltage based at least in part on sharing the charge of the second subset of word lines with the third subset of word lines, where the first logic state is written to a third subset of the plurality of non-volatile memory cells of the memory device based at least in part on driving the third subset of word lines of the memory device to the second voltage.

In some examples, the reception component 1055 may be configured as or otherwise support a means for receiving, at the memory device, signaling to transition the memory device from the first power state to the second power state, where driving the first subset of digit lines of the memory device to the first voltage is based at least in part on receiving the signaling.

In some examples, the decoupling component 1060 may be configured as or otherwise support a means for decoupling the first subset of word lines from the second subset of word lines a duration after coupling the first subset of word lines to the second subset of word lines and before driving the second subset of word lines to the second voltage. In some examples, the decoupling component 1060 may be configured as or otherwise support a means for decoupling a power supply from a driver for the first subset of word lines before coupling the first subset of word lines to the second subset of word lines.

In some examples, the first subset of the plurality of non-volatile memory cells and the second subset of the plurality of non-volatile memory cells are associated with a first portion of a plate. In some examples, writing the first logic state to the first subset of the plurality of non-volatile memory cells and the second subset of the plurality of non-volatile memory cells is based at least in part on driving the first portion of the plate to a third voltage.

Figure 11:
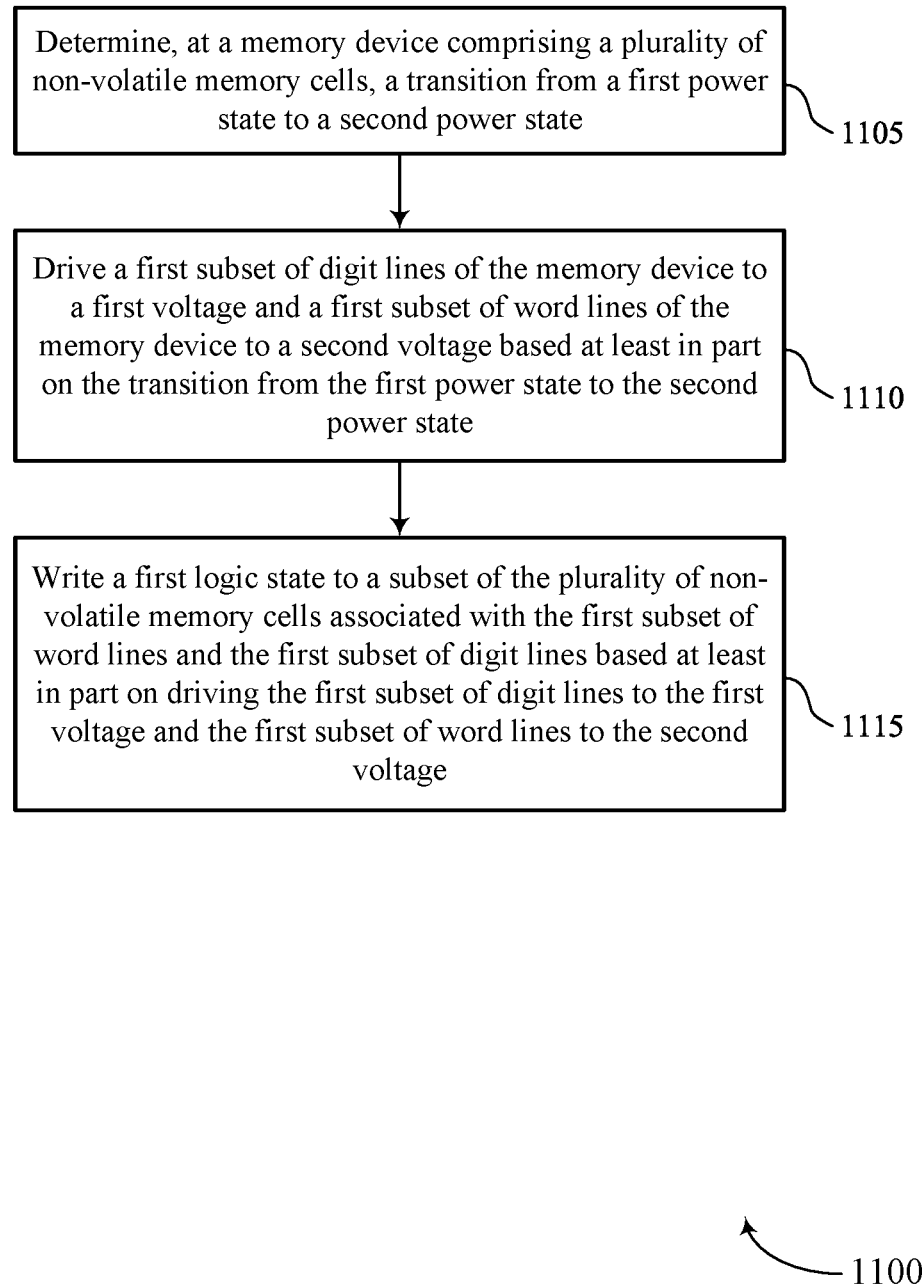
FIGS. 11 and 12 show flowcharts illustrating a method or methods that support cell data bulk reset in accordance with examples as disclosed herein.

FIG. 11 shows a flowchart illustrating a method 1100 that supports cell data bulk reset in accordance with examples as disclosed herein. The operations of method 1100 may be implemented by a memory controller or its components as described herein. For example, the operations of method 1100 may be performed by a memory controller as described with reference to FIGS. 1 through 9. In some examples, a memory controller may execute a set of instructions to control the functional elements of the device to perform the described functions. Additionally or alternatively, the memory controller may perform aspects of the described functions using special-purpose hardware.

At 1105, the method may include determining, at a memory device including a plurality of non-volatile memory cells, a transition from a first power state to a second power state. The operations of 1105 may be performed in accordance with examples as disclosed herein. In some examples, aspects of the operations of 1105 may be performed by a determination component 925 as described with reference to FIG. 9.

At 1110, the method may include driving a first subset of digit lines of the memory device to a first voltage and a first subset of word lines of the memory device to a second voltage based at least in part on the transition from the first power state to the second power state. The operations of 1110 may be performed in accordance with examples as disclosed herein. In some examples, aspects of the operations of 1110 may be performed by a digit line driver 930 as described with reference to FIG. 9.

At 1115, the method may include writing a first logic state to a subset of the plurality of non-volatile memory cells associated with the first subset of word lines and the first subset of digit lines based at least in part on driving the first subset of digit lines to the first voltage and the first subset of word lines to the second voltage. The operations of 1115 may be performed in accordance with examples as disclosed herein. In some examples, aspects of the operations of 1115 may be performed by a writing component 935 as described with reference to FIG. 9.

In some examples, an apparatus as described herein may perform a method or methods, such as the method 1100. The apparatus may include, features, circuitry, logic, means, or instructions (e.g., a non-transitory computer-readable medium storing instructions executable by a processor) for determining, at a memory device including a plurality of non-volatile memory cells, a transition from a first power state to a second power state, driving a first subset of digit lines of the memory device to a first voltage and a first subset of word lines of the memory device to a second voltage based at least in part on the transition from the first power state to the second power state, and writing a first logic state to a subset of the plurality of non-volatile memory cells associated with the first subset of word lines and the first subset of digit lines based at least in part on driving the first subset of digit lines to the first voltage and the first subset of word lines to the second voltage.

Some examples of the method 1100 and the apparatus described herein may further include operations, features, circuitry, logic, means, or instructions for driving a plate associated with the plurality of non-volatile memory cells to the second voltage based at least in part on driving the first subset of digit lines of the memory device to the first voltage, where writing the first logic state to the subset of the plurality of non-volatile memory cells associated with the first subset of word lines and the first subset of digit lines may be based at least in part on driving the first subset of word lines and the plate to the second voltage.

Some examples of the method 1100 and the apparatus described herein may further include operations, features, circuitry, logic, means, or instructions for receiving, at the memory device, a signal to transition the memory device from the first power state to the second power state, where driving the plate to the first voltage may be based at least in part on receiving the signal to transition the memory device from the first power state to the second power state.

Some examples of the method 1100 and the apparatus described herein may further include operations, features, circuitry, logic, means, or instructions for driving the first subset of word lines to a third voltage based at least in part on writing the first logic state to the plurality of non-volatile memory cells, driving a third subset of word lines of the memory device to the first voltage, driving a fourth subset of digit lines of the memory device to the second voltage based at least in part on driving the third subset of word lines to the first voltage, and writing the first logic state to a second plurality of non-volatile memory cells associated with the third subset of word lines and the fourth subset of digit lines based at least in part on driving the fourth subset of digit lines of the memory device to the second voltage.

Some examples of the method 1100 and the apparatus described herein may further include operations, features, circuitry, logic, means, or instructions for driving a second plate associated with the second plurality of non-volatile memory cells to the first voltage based at least in part on driving the fourth subset of digit lines of the memory device to the second voltage, where writing the first logic state to the second plurality of non-volatile memory cells associated with the third subset of word lines and the fourth subset of digit lines may be based at least in part on driving the third subset of word lines to the first voltage and the second plate to the first voltage.

In some examples of the method 1100 and the apparatus described herein, the plurality of non-volatile memory cells may be associated with a first deck of non-volatile memory cells of the memory device and the second plurality of non-volatile memory cells may be associated with a second deck of non-volatile memory cells of the memory device.

In some examples of the method 1100 and the apparatus described herein, determining the transition from the first power state to the second power state may include operations, features, circuitry, logic, means, or instructions for receiving a command at the memory device, where the memory device transitions from the first power state to the second power state based at least in part on receiving the command.

In some examples of the method 1100 and the apparatus described herein, the first power state or the second power state corresponds to a powered-off state.

Figure 12:
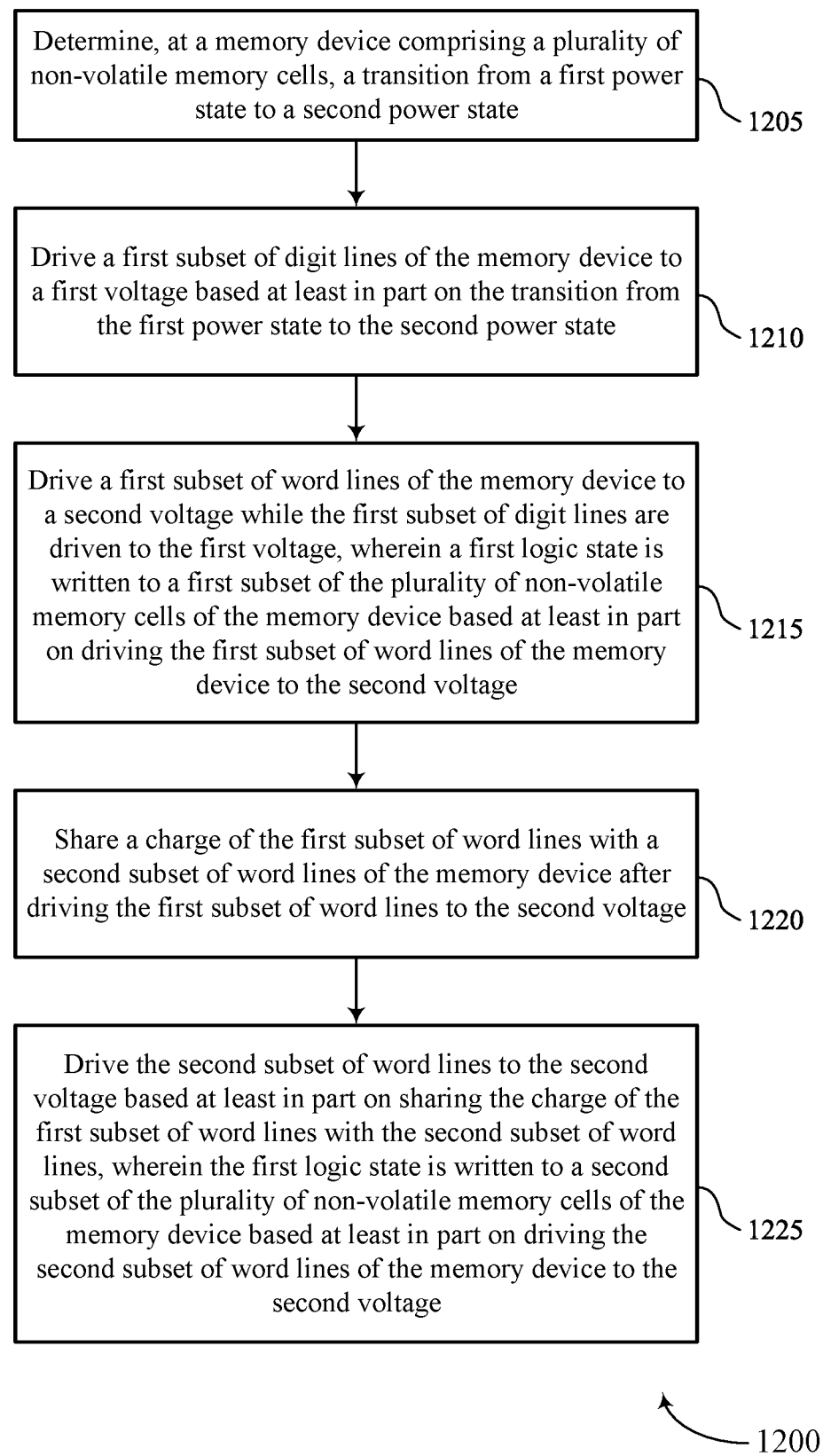

FIG. 12 shows a flowchart illustrating a method 1200 that supports cell data bulk reset in accordance with examples as disclosed herein. The operations of method 1200 may be implemented by a memory controller or its components as described herein. For example, the operations of method 1200 may be performed by a memory controller as described with reference to FIGS. 1 through 8 and 10. In some examples, a memory controller may execute a set of instructions to control the functional elements of the device to perform the described functions. Additionally or alternatively, the memory controller may perform aspects of the described functions using special-purpose hardware.

At 1205, the method may include determining, at a memory device including a plurality of non-volatile memory cells, a transition from a first power state to a second power state. The operations of 1205 may be performed in accordance with examples as disclosed herein. In some examples, aspects of the operations of 1205 may be performed by a determination component 1025 as described with reference to FIG. 10.

At 1210, the method may include driving a first subset of digit lines of the memory device to a first voltage based at least in part on the transition from the first power state to the second power state. The operations of 1210 may be performed in accordance with examples as disclosed herein. In some examples, aspects of the operations of 1210 may be performed by a digit line driver 1030 as described with reference to FIG. 10.

At 1215, the method may include driving a first subset of word lines of the memory device to a second voltage while the first subset of digit lines are driven to the first voltage, where a first logic state is written to a first subset of the plurality of non-volatile memory cells of the memory device based at least in part on driving the first subset of word lines of the memory device to the second voltage. The operations of 1215 may be performed in accordance with examples as disclosed herein. In some examples, aspects of the operations of 1215 may be performed by a first word line driver 1035 as described with reference to FIG. 10.

At 1220, the method may include sharing a charge of the first subset of word lines with a second subset of word lines of the memory device after driving the first subset of word lines to the second voltage. The operations of 1220 may be performed in accordance with examples as disclosed herein. In some examples, aspects of the operations of 1220 may be performed by a first word line driver 1035 as described with reference to FIG. 10.

At 1225, the method may include driving the second subset of word lines to the second voltage based at least in part on sharing the charge of the first subset of word lines with the second subset of word lines, where the first logic state is written to a second subset of the plurality of non-volatile memory cells of the memory device based at least in part on driving the second subset of word lines of the memory device to the second voltage. The operations of 1225 may be performed in accordance with examples as disclosed herein. In some examples, aspects of the operations of 1225 may be performed by a second word line driver 1040 as described with reference to FIG. 10.

In some examples, an apparatus as described herein may perform a method or methods, such as the method 1200. The apparatus may include, features, circuitry, logic, means, or instructions (e.g., a non-transitory computer-readable medium storing instructions executable by a processor) for determining, at a memory device including a plurality of non-volatile memory cells, a transition from a first power state to a second power state, driving a first subset of digit lines of the memory device to a first voltage based at least in part on the transition from the first power state to the second power state, driving a first subset of word lines of the memory device to a second voltage while the first subset of digit lines are driven to the first voltage, where a first logic state is written to a first subset of the plurality of non-volatile memory cells of the memory device based at least in part on driving the first subset of word lines of the memory device to the second voltage, sharing a charge of the first subset of word lines with a second subset of word lines of the memory device after driving the first subset of word lines to the second voltage, and driving the second subset of word lines to the second voltage based at least in part on sharing the charge of the first subset of word lines with the second subset of word lines, where the first logic state is written to a second subset of the plurality of non-volatile memory cells of the memory device based at least in part on driving the second subset of word lines of the memory device to the second voltage.

In some examples of the method 1200 and the apparatus described herein, sharing the charge of the first subset of word lines with the second subset of word lines may include operations, features, circuitry, logic, means, or instructions for coupling the first subset of word lines to the second subset of word lines after driving the first subset of word lines to the second voltage and before driving the second subset of word lines to the second voltage, where the charge may be shared between the first subset of word lines and the second subset of word lines based at least in part on coupling the first subset of word lines to the second subset of word lines.

Some examples of the method 1200 and the apparatus described herein may further include operations, features, circuitry, logic, means, or instructions for decoupling the first subset of word lines from the second subset of word lines a duration after coupling the first subset of word lines to the second subset of word lines and before driving the second subset of word lines to the second voltage.

Some examples of the method 1200 and the apparatus described herein may further include operations, features, circuitry, logic, means, or instructions for driving the first subset of word lines to a third voltage after decoupling the first subset of word lines from the second subset of word lines.

Some examples of the method 1200 and the apparatus described herein may further include operations, features, circuitry, logic, means, or instructions for decoupling a power supply from a driver for the first subset of word lines before coupling the first subset of word lines to the second subset of word lines.

Some examples of the method 1200 and the apparatus described herein may further include operations, features, circuitry, logic, means, or instructions for sharing a charge of the second subset of word lines with a third subset of word lines of the memory device after driving the second subset of word lines to the second voltage and driving the third subset of word lines to the second voltage based at least in part on sharing the charge of the second subset of word lines with the third subset of word lines, where the first logic state may be written to a third subset of the plurality of non-volatile memory cells of the memory device based at least in part on driving the third subset of word lines of the memory device to the second voltage.

In some examples of the method 1200 and the apparatus described herein, the first subset of the plurality of non-volatile memory cells and the second subset of the plurality of non-volatile memory cells may be associated with a first portion of a plate, and writing the first logic state to the first subset of the plurality of non-volatile memory cells and the second subset of the plurality of non-volatile memory cells may be based at least in part on driving the first portion of the plate to a third voltage.

Some examples of the method 1200 and the apparatus described herein may further include operations, features, circuitry, logic, means, or instructions for receiving, at the memory device, signaling to transition the memory device from the first power state to the second power state, where driving the first subset of digit lines of the memory device to the first voltage may be based at least in part on receiving the signaling.

It should be noted that the methods described herein are possible implementations, and that the operations and the steps may be rearranged or otherwise modified and that other implementations are possible. Furthermore, portions from two or more of the methods may be combined.

Another apparatus is described. The apparatus may include a memory array including a plurality of non-volatile memory cells, a controller coupled with the memory array, the controller operable to, determine a transition from a first power state to a second power state, drive a first subset of digit lines of the memory array to a first voltage and a first subset of word lines of the memory array to a second voltage based at least in part on the transition from the first power state to the second power state, and write a first logic state to a subset of the plurality of non-volatile memory cells associated with the first subset of word lines and the first subset of digit lines based at least in part on driving the first subset of digit lines of the memory array to the second voltage and the first subset of word lines to the second voltage.

In some examples, the apparatus may include drive a plate associated with the plurality of non-volatile memory cells to the second voltage based at least in part on driving the first subset of digit lines of the memory device to the first voltage, where writing the first logic state to the subset of the plurality of non-volatile memory cells associated with the first subset of word lines and the first subset of digit lines may be based at least in part on driving the first subset of word lines and the plate to the second voltage.

In some examples, the apparatus may include receive a signal to transition the memory array from the first power state to the second power state, where driving the plate to the first voltage may be based at least in part on receiving the signal to transition the memory array from the first power state to the second power state.

In some examples, the apparatus may include drive the first subset of word lines to a third voltage based at least in part on writing the first logic state to the plurality of non-volatile memory cells, drive a third subset of word lines of the memory array to the first voltage, drive a fourth subset of digit lines of the memory array to the second voltage based at least in part on driving the third subset of word lines to the first voltage, and write the first logic state to a second plurality of non-volatile memory cells associated with the third subset of word lines and the fourth subset of digit lines based at least in part on driving the fourth subset of digit lines of the memory array to the second voltage.

In some examples, the apparatus may include drive a second plate associated with the second plurality of non-volatile memory cells to the first voltage based at least in part on driving the fourth subset of digit lines of the memory array to the second voltage, where writing the first logic state to the second plurality of non-volatile memory cells associated with the third subset of word lines and the fourth subset of digit lines may be based at least in part on driving the third subset of word lines to the first voltage and the second plate to the first voltage.

In some examples of the apparatus, the plurality of non-volatile memory cells may be associated with a first deck of non-volatile memory cells of the memory array and the second plurality of non-volatile memory cells may be associated with a second deck of non-volatile memory cells of the memory array.

In some examples, the apparatus may include receive a command, where the memory device transitions from the first power state to the second power state based at least in part on receiving the command.

In some examples of the apparatus, the first power state or the second power state corresponds to a powered-off state.

Another apparatus is described. The apparatus may include a memory array including a plurality of non-volatile memory cells, a controller coupled with the memory array and operable to determine a transition from a first power state to a second power state, a first driver coupled with the memory array and configured to drive a first subset of digit lines of the memory array to a first voltage based at least in part on the transition from the first power state to the second power state, a second driver coupled with the memory array and configured to drive a first subset of word lines of the memory array to a second voltage while the first subset of digit lines are driven to the first voltage, where a first logic state is written to a first subset of the plurality of non-volatile memory cells of the memory array based at least in part on the second driver driving the first subset of word lines of the memory array to the second voltage, and a third driver coupled with the memory array and configured to drive a second subset of word lines to the second voltage based at least in part on a charge of the first subset of word lines being shared with the second subset of word lines after the first subset of word lines being driven to the second voltage, where the first logic state is written to a second subset of the plurality of non-volatile memory cells of the memory array based at least in part on driving the second subset of word lines of the memory array to the second voltage.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    determining, at a memory device comprising a plurality of non-volatile memory cells, a transition from a first power state to a second power state;
    selecting a first subset of word lines of the memory device based at least in part on the transition from the first power state to the second power state;
    driving a first subset of digit lines of the memory device to a first voltage and the first subset of word lines of the memory device to a second voltage based at least in part on selecting the first subset of word lines of the memory device; and
    writing a first logic state to a subset of the plurality of non-volatile memory cells associated with the first subset of word lines and the first subset of digit lines based at least in part on driving the first subset of digit lines to the first voltage and the first subset of word lines to the second voltage.

2. The method of claim 1, further comprising:
    driving a plate associated with the plurality of non-volatile memory cells to the second voltage based at least in part on driving the first subset of digit lines of the memory device to the first voltage, wherein writing the first logic state to the subset of the plurality of non-volatile memory cells associated with the first subset of word lines and the first subset of digit lines is based at least in part on driving the first subset of word lines and the plate to the second voltage.

3. The method of claim 2, further comprising:
    receiving, at the memory device, a signal to transition the memory device from the first power state to the second power state, wherein driving the plate to the first voltage is based at least in part on receiving the signal to transition the memory device from the first power state to the second power state.

4. The method of claim 1, wherein determining the transition from the first power state to the second power state comprises:
    receiving a command at the memory device, wherein the memory device transitions from the first power state to the second power state based at least in part on receiving the command.

5. The method of claim 1, wherein the first power state or the second power state corresponds to a powered-off state.

6. A method, comprising:
    determining, at a memory device comprising a plurality of non-volatile memory cells, a transition from a first power state to a second power state;
    driving a first subset of digit lines of the memory device to a first voltage and a first subset of word lines of the memory device to a second voltage based at least in part on the transition from the first power state to the second power state;
    writing a first logic state to a subset of the plurality of non-volatile memory cells associated with the first subset of word lines and the first subset of digit lines based at least in part on driving the first subset of digit lines to the first voltage and the first subset of word lines to the second voltage;
    driving the first subset of word lines to a third voltage based at least in part on writing the first logic state to the plurality of non-volatile memory cells;
    driving a third subset of word lines of the memory device to the first voltage;
    driving a fourth subset of digit lines of the memory device to the second voltage based at least in part on driving the third subset of word lines to the first voltage; and
    writing the first logic state to a second plurality of non-volatile memory cells associated with the third subset of word lines and the fourth subset of digit lines based at least in part on driving the fourth subset of digit lines of the memory device to the second voltage.

7. The method of claim 6, further comprising:
    driving a second plate associated with the second plurality of non-volatile memory cells to the first voltage based at least in part on driving the fourth subset of digit lines of the memory device to the second voltage, wherein writing the first logic state to the second plurality of non-volatile memory cells associated with the third subset of word lines and the fourth subset of digit lines is based at least in part on driving the third subset of word lines to the first voltage and the second plate to the first voltage.

8. The method of claim 6, wherein the plurality of non-volatile memory cells are associated with a first deck of non-volatile memory cells of the memory device and the second plurality of non-volatile memory cells is associated with a second deck of non-volatile memory cells of the memory device.

9. A method, comprising:
    determining, at a memory device comprising a plurality of non-volatile memory cells, a transition from a first power state to a second power state;
    driving a first subset of digit lines of the memory device to a first voltage based at least in part on the transition from the first power state to the second power state;
    driving a first subset of word lines of the memory device to a second voltage while the first subset of digit lines are driven to the first voltage, wherein a first logic state is written to a first subset of the plurality of non-volatile memory cells of the memory device based at least in part on driving the first subset of word lines of the memory device to the second voltage;

sharing a charge of the first subset of word lines with a second subset of word lines of the memory device after driving the first subset of word lines to the second voltage; and driving the second subset of word lines to the second voltage based at least in part on sharing the charge of the first subset of word lines with the second subset of word lines, wherein the first logic state is written to a second subset of the plurality of non-volatile memory cells of the memory device based at least in part on driving the second subset of word lines of the memory device to the second voltage.

10. The method of claim 9, wherein sharing the charge of the first subset of word lines with the second subset of word lines comprises:

coupling the first subset of word lines to the second subset of word lines after driving the first subset of word lines to the second voltage and before driving the second subset of word lines to the second voltage, wherein the charge is shared between the first subset of word lines and the second subset of word lines based at least in part on coupling the first subset of word lines to the second subset of word lines.

11. The method of claim 10, further comprising:
decoupling the first subset of word lines from the second subset of word lines a duration after coupling the first subset of word lines to the second subset of word lines and before driving the second subset of word lines to the second voltage.

12. The method of claim 11, further comprising:
driving the first subset of word lines to a third voltage after decoupling the first subset of word lines from the second subset of word lines.

13. The method of claim 11, further comprising:
decoupling a power supply from a driver for the first subset of word lines before coupling the first subset of word lines to the second subset of word lines.

14. The method of claim 9, further comprising:
sharing a charge of the second subset of word lines with a third subset of word lines of the memory device after driving the second subset of word lines to the second voltage; and driving the third subset of word lines to the second voltage based at least in part on sharing the charge of the second subset of word lines with the third subset of word lines, wherein the first logic state is written to a third subset of the plurality of non-volatile memory cells of the memory device based at least in part on driving the third subset of word lines of the memory device to the second voltage.

15. The method of claim 9, wherein:
the first subset of the plurality of non-volatile memory cells and the second subset of the plurality of non-volatile memory cells are associated with a first portion of a plate; and writing the first logic state to the first subset of the plurality of non-volatile memory cells and the second subset of the plurality of non-volatile memory cells is based at least in part on driving the first portion of the plate to a third voltage.

16. The method of claim 9, further comprising:
receiving, at the memory device, signaling to transition the memory device from the first power state to the second power state, wherein driving the first subset of digit lines of the memory device to the first voltage is based at least in part on receiving the signaling.

17. An apparatus, comprising:
a memory array comprising a plurality of non-volatile memory cells; and
a controller coupled with the memory array, the controller operable to:
determine a transition from a first power state to a second power state;
select a first subset of word lines of the memory array based at least in part on the transition from the first power state to the second power state;
drive a first subset of digit lines of the memory array to a first voltage and the first subset of word lines of the memory array to a second voltage based at least in part on selecting the first subset of word lines of the memory array; and
write a first logic state to a subset of the plurality of non-volatile memory cells associated with the first subset of word lines and the first subset of digit lines based at least in part on driving the first subset of digit lines of the memory array to the second voltage and the first subset of word lines to the second voltage.

18. The apparatus of claim 17, wherein the controller is operable to:
drive a plate associated with the plurality of non-volatile memory cells to the second voltage based at least in part on driving the first subset of digit lines of the memory array to the first voltage, wherein writing the first logic state to the subset of the plurality of non-volatile memory cells associated with the first subset of word lines and the first subset of digit lines is based at least in part on driving the first subset of word lines and the plate to the second voltage.

19. The apparatus of claim 18, wherein the controller is operable to:
receive a signal to transition the memory array from the first power state to the second power state, wherein driving the plate to the first voltage is based at least in part on receiving the signal to transition the memory array from the first power state to the second power state.

20. The apparatus of claim 17, wherein the controller is operable to:
drive the first subset of word lines to a third voltage based at least in part on writing the first logic state to the plurality of non-volatile memory cells;
drive a third subset of word lines of the memory array to the first voltage;
drive a fourth subset of digit lines of the memory array to the second voltage based at least in part on driving the third subset of word lines to the first voltage; and
write the first logic state to a second plurality of non-volatile memory cells associated with the third subset of word lines and the fourth subset of digit lines based at least in part on driving the fourth subset of digit lines of the memory array to the second voltage.

21. The apparatus of claim 20, wherein the controller is operable to:
drive a second plate associated with the second plurality of non-volatile memory cells to the first voltage based at least in part on driving the fourth subset of digit lines of the memory array to the second voltage, wherein writing the first logic state to the second plurality of non-volatile memory cells associated with the third subset of word lines and the fourth subset of digit lines is based at least in part on driving the third subset of word lines to the first voltage and the second plate to the first voltage.

22. The apparatus of claim 20, wherein the plurality of non-volatile memory cells are associated with a first deck of non-volatile memory cells of the memory array and the second plurality of non-volatile memory cells is associated with a second deck of non-volatile memory cells of the memory array.

23. The apparatus of claim 17, wherein, to determine the transition from the first power state to the second power state, the controller is operable to:

receive a command, wherein the memory array transitions from the first power state to the second power state based at least in part on receiving the command.

24. The apparatus of claim 17, wherein the first power state or the second power state corresponds to a powered-off state.

25. An apparatus, comprising:
a memory array comprising a plurality of non-volatile memory cells;
a controller coupled with the memory array and operable to determine a transition from a first power state to a second power state;
a first driver coupled with the memory array and configured to drive a first subset of digit lines of the memory array to a first voltage based at least in part on the transition from the first power state to the second power state;
a second driver coupled with the memory array and configured to drive a first subset of word lines of the memory array to a second voltage while the first subset of digit lines are driven to the first voltage, wherein a first logic state is written to a first subset of the plurality of non-volatile memory cells of the memory array based at least in part on the second driver driving the first subset of word lines of the memory array to the second voltage; and
a third driver coupled with the memory array and configured to drive a second subset of word lines to the second voltage based at least in part on a charge of the first subset of word lines being shared with the second subset of word lines after the first subset of word lines being driven to the second voltage, wherein the first logic state is written to a second subset of the plurality of non-volatile memory cells of the memory array based at least in part on driving the second subset of word lines of the memory array to the second voltage.

* * * * *